US012684959B2

(12) United States Patent
Kwon

(10) Patent No.: US 12,684,959 B2
(45) Date of Patent: Jul. 14, 2026

(54) DISPLAY DEVICE AND METHOD OF MANUFACTURING THE SAME

(71) Applicant: SAMSUNG DISPLAY CO., LTD., Yongin-si (KR)

(72) Inventor: Ohjune Kwon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 709 days.

(21) Appl. No.: 17/972,836

(22) Filed: Oct. 25, 2022

(65) Prior Publication Data

US 2023/0131110 A1     Apr. 27, 2023

(30) Foreign Application Priority Data

Oct. 26, 2021    (KR) ......................... 10-2021-0144010

(51) Int. Cl.
| | |
|---|---|
| *H01L 27/32* | (2006.01) |
| *H01L 51/56* | (2006.01) |
| *H10K 59/124* | (2023.01) |
| *H10K 59/80* | (2023.01) |
| *H10K 71/00* | (2023.01) |
| *H10K 59/12* | (2023.01) |

(52) U.S. Cl.
CPC ......... *H10K 59/124* (2023.02); *H10K 59/873* (2023.02); *H10K 71/00* (2023.02); *H10K 59/1201* (2023.02)

(58) Field of Classification Search
CPC ......................... H10K 50/844; H10K 50/8426
See application file for complete search history.

(56) References Cited

U.S. PATENT DOCUMENTS

| | | | |
|---|---|---|---|
| 9,136,502 B2 | 9/2015 | Kwack et al. | |
| 9,736,938 B2 | 8/2017 | Park et al. | |
| 10,396,310 B2 | 8/2019 | Choi et al. | |
| 10,964,913 B2 | 3/2021 | Moon et al. | |
| 11,380,858 B2 | 7/2022 | Lee et al. | |
| 11,758,794 B2 | 9/2023 | Jang et al. | |
| 2006/0158111 A1* | 7/2006 | Hayashi ............. | H10K 59/8722 |
| | | | 428/917 |

(Continued)

FOREIGN PATENT DOCUMENTS

| | | | |
|---|---|---|---|
| KR | 1020070050763 A | 5/2007 | |
| KR | 101436025 B1 | 8/2014 | |

(Continued)

OTHER PUBLICATIONS

Korean Intellectual Property Office, Request for the Submission of an Opinion, Application No. 10-2021-0144010, Nov. 21, 2025, all pages. (Year: 2025).*

*Primary Examiner* — Victoria K. Hall
(74) *Attorney, Agent, or Firm* — CANTOR COLBURN LLP

(57) ABSTRACT

A display device includes: a substrate; a display area on the substrate, where the display area includes a plurality of pixels; a peripheral area on the substrate, where the peripheral area is on a periphery of the display area; a first protective layer on the substrate, where the first protective layer is in the display area and the peripheral area; and a second protective layer on the substrate, where the second protective layer is in the display area and the peripheral area. The first protective layer and the second protective layer overlap each other.

9 Claims, 26 Drawing Sheets

(56)        References Cited

U.S. PATENT DOCUMENTS

2021/0234122 A1*  7/2021  Choi ....................... H02P 11/04

FOREIGN PATENT DOCUMENTS

| KR | 1020160098559 A | 8/2016 | |
|----|-----------------|--------|---|
| KR | 1020170003332 A | 1/2017 | |
| KR | 1020180091987 A | 8/2018 | |
| KR | 1020200066497 A | 6/2020 | |
| KR | 1020200110494 A | 9/2020 | |
| KR | 102216287 B1 | 2/2021 | |
| KR | 1020210079614 A | 6/2021 | |
| WO | WO2020054915 A1 * | 3/2020 | ........... H10K 50/844 |

* cited by examiner

DISPLAY DEVICE AND METHOD OF MANUFACTURING THE SAME

This application claims priority to Korean Patent Application No. 10-2021-0144010, filed on Oct. 26, 2021, and all the benefits accruing therefrom under 35 U.S.C. § 119, the content of which in its entirety is herein incorporated by reference.

BACKGROUND

1. Field

One or more embodiments of the disclosure relate to a device and a method, and more particularly, to a display device and a method of manufacturing the display device.

2. Description of the Related Art

Recently, portable display devices have been widely used in various fields. As such portable display devices, tablet personal computers ("PC"s), as well as small-sized display devices such as mobile phones, have been widely used recently.

Such a portable display device may include a display device capable of supporting various functions and providing a user with visual information such as images or videos. Recently, as the size of components for driving display devices has been reduced, the relative size of the display panel in a display device has gradually increased, and a structure capable of being bent by a predetermined angle from a flat state has been developed.

The display device may include various wirings arranged therein. In such a display device, the wirings may be disconnected due to curves in each layer.

SUMMARY

In a display device, steps in each layer therein may be reduced, or various layers may be formed to reinforce bent portions to prevent disconnection in wirings due to steps in each layer. Various layers are manufactured through separate processes, and thus, process steps and process time in the manufacturing process may increase. One or more embodiments of the present disclosure provide a display device that may be manufactured to prevent the wirings from breaking with reduced time.

According to an embodiment, a display device includes a substrate, a display area on the substrate, where the display area includes a plurality of pixels, a peripheral area on the substrate, where the peripheral area is on a periphery of the display area, a first protective layer on the substrate, where the first protective layer is in the display area and the peripheral area, and a second protective layer on the substrate, where the second protective layer is in the display area and the peripheral area. In such an embodiment, the first protective layer and the second protective layer overlap each other.

In an embodiment, an end portion of one of the first protective layer and the second protective layer and an end portion of the other of the first protective layer and the second protective layer may be sequentially stacked one on another.

In an embodiment, the first protective layer may be arranged in a first direction and the second protective layer may be arranged in a second direction that is different from the first direction.

In an embodiment, the first protective layer and the second protective layer may include different materials from each other.

In an embodiment, the display device may further include an opening area in the substrate, where a component is provided in the opening area, and a third protective layer on a circumference of the opening area.

In an embodiment, a planar shape of the third protective layer may be a loop shape.

In an embodiment, a part of the third protective layer may overlap a part of the first protective layer.

In an embodiment, the first protective layer may surround a boundary of the display area.

In an embodiment, the first protective layer may be provided in plural, and a plurality of first protective layers may be spaced apart from one another along the boundary of the display area.

According to an embodiment, a method of manufacturing a display device includes providing a first protective layer-forming material on a substrate, providing a second protective layer-forming material on the substrate, providing a photoresist on the substrate, the first protective layer-forming material, and the second protective layer-forming material, forming a first protective layer forming pattern and a second protective layer forming pattern by using the photoresist on the first protective layer-forming material and the second protective layer-forming material, and removing the first protective layer forming material except for a portion of the first protective layer-forming material under the first protective layer forming pattern, and removing the second protective layer forming material except for a portion of the second protective layer-forming material under the second protective layer forming pattern.

In an embodiment, the first protective layer-forming material and the second protective layer-forming material may include different materials from each other.

In an embodiment, a part of the first protective layer-forming material and a part of the second protective layer-forming material may be stacked with each other.

In an embodiment, the first protective layer-forming material and the second protective layer-forming material may be spaced from each other.

In an embodiment, the method may further include providing a third protective layer-forming material on the substrate.

In an embodiment, the third protective layer-forming material may have a loop shape.

In an embodiment, the photoresist may be further provided on the third protective layer-forming material, and the method may further include forming a third protective layer forming pattern by using the photoresist on the third protective layer-forming material.

In an embodiment, the method may further include removing the third protective layer-forming material except for a portion of the third protective layer-forming material under the third protective layer forming pattern.

In an embodiment, the first protective layer-forming material and the second protective layer-forming material may be on a touch insulating layer which is on the substrate.

In an embodiment, the photoresist may include a first photoresist on a first area of the substrate, and a second photoresist on a second area of the substrate.

In an embodiment, one of the first photoresist and the second photoresist may include a positive photoresist, and the other of the first photoresist and the second photoresist may include a negative photoresist.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
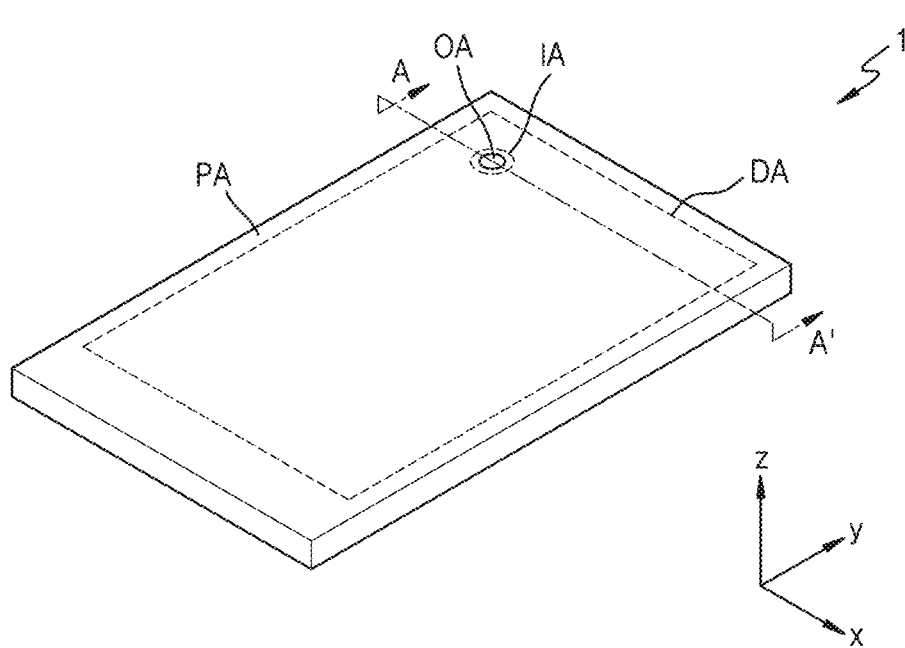
FIG. 1 is a perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As the disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a perspective view of a display device 1 according to an embodiment.

Referring to FIG. 1, an embodiment of the display device 1 is a device for displaying video or still images and may be used as a portable display device such as a mobile phone, a smartphone, a tablet personal computer ("PC"), a mobile communication terminal, an electronic notebook, an electronic book, a portable multimedia player ("PMP"), a navigation terminal, an ultra-mobile PC ("UMPC"), etc., and also as a display screen in various products such as a television, a laptop computer, a monitor, a billboard, internet of things ("IoT") device, etc. In an embodiment, the display device 1 may be used in wearable devices such as a smartwatch, a watch phone, a glasses-type display, and a head-mounted display ("HMD"). In an embodiment, the display device 1 may be used in a dashboard of a vehicle, a center information display in a center fascia or dashboard of a vehicle, a rear-view mirror display that replaces a side-view mirror of a vehicle, or a display in a rear side of a front seat as an entertainment for the back seat in a vehicle. FIG. 1 shows an embodiment where the display device 1 is used as a smartphone, for convenience of illustration and description, but not being limited thereto.

In an embodiment, the display device 1 may have a rectangular shape on a plane. In an embodiment, for example, the display device 1 may have a rectangular plane having shorter sides in an x-direction and longer sides in a y-direction. A corner where the shorter side in the x-direction and the longer side in the y-direction meet each other may have a round shape having a certain curvature or a right-angled shape. The planar shape of the display device 1 is not limited to the rectangular shape, but may have another polygonal shape, an elliptical shape, or a non-defined shape.

The display device 1 may include an opening area OA (or first area) and a display area DA (or second area) at least partially surrounding the opening area OA. The display device 1 may include an intermediate area IA as a third area located between the opening area OA and the display area DA, and a peripheral area PA (or fourth area) on an outer side of the display area DA, e.g., surrounding the display area DA.

The opening area OA may be located inside the display area DA. In an embodiment, the opening area OA may be arranged at an upper left side of the display area DA as shown in FIG. 1. Alternatively, the opening area OA may be variously arranged, for example, in a center of the display area DA or at an upper right side of the display area DA. In a plan view herein, left, right, up, and down directions denote directions when the display device 1 is seen from a direction perpendicular to the display device 1. In an embodiment, for example, the left direction denotes −x direction, the right direction denotes +x direction, the upper direction denotes +y direction, and the lower direction denotes −y direction. In an embodiment, as shown in FIG. 1, a single opening area OA is defined, but in an alternative embodiment, a plurality of opening areas OA may be defined in the display device 1.

Figure 2:
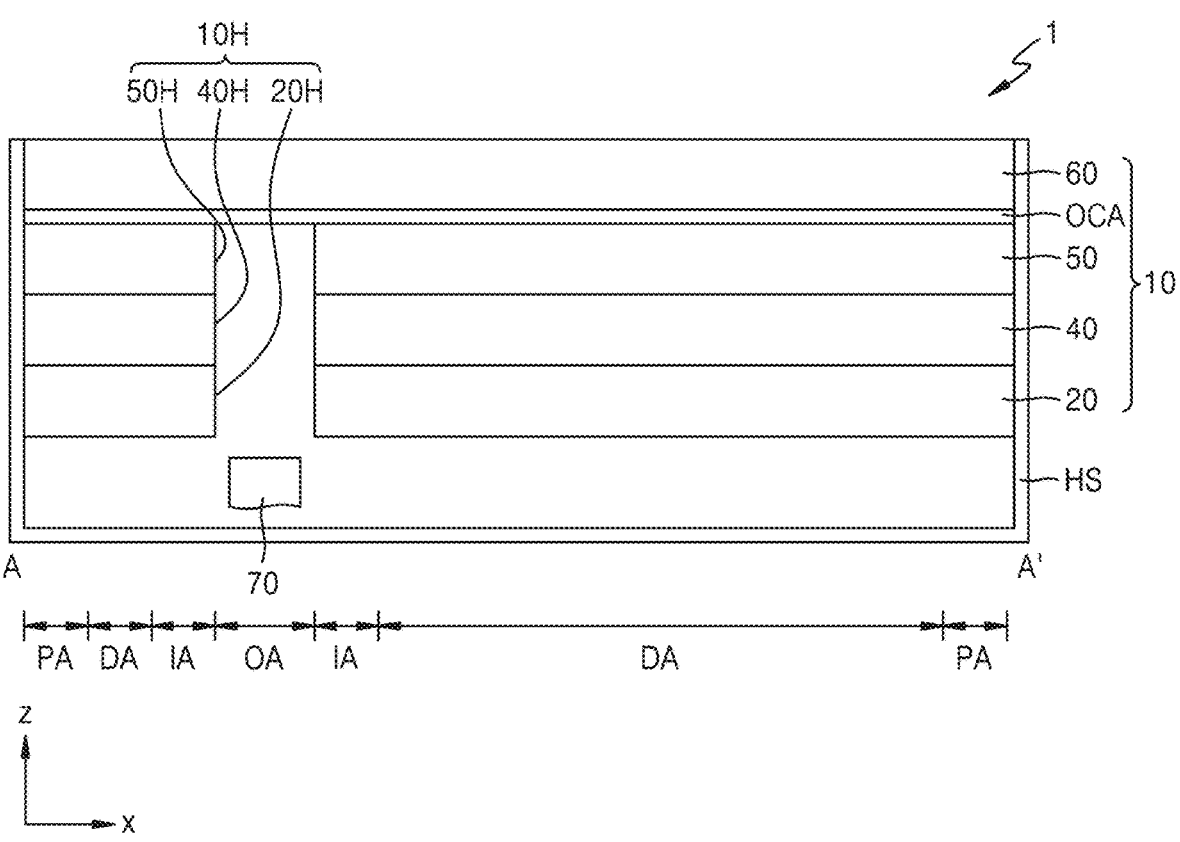
FIG. 2 is a cross-sectional view of the display device of FIG. 1 taken along line A-A' of FIG. 1, according to an embodiment.

FIG. 2 is a cross-sectional view of the display device of FIG. 1 taken along line A-A' of FIG. 1, according to an embodiment.

Referring to FIG. 2, an embodiment of the display device 1 may include a display panel 10 and a component 70 in the opening area OA of the display panel 10. The display panel 10 and the component 70 may be accommodated in a housing HS.

The display panel 10 may include a display element layer 20, an input sensing layer 40, an optical functional layer 50, and a cover window 60.

The display element layer 20 may include display elements (or light-emitting elements) emitting light for displaying images. The display element may include a light-emitting diode, e.g., an organic light-emitting diode including an organic emission layer.

The input sensing layer 40 may obtain coordinate information corresponding to an external input, e.g., a touch event. The input sensing layer 40 may include a sensing electrode (or touch electrode) and trace lines connected to the sensing electrode. The input sensing layer 40 may be on the display element layer 20. The input sensing layer 40 may sense an external input by a mutual capacitance method and/or a self-capacitance method.

The input sensing layer 40 may be directly on the display element layer 20 or may be separately manufactured and then coupled to the display element layer 20 via an adhesive layer such as an optically clear adhesive. In an embodiment, for example, the input sensing layer 40 may be arranged successively after a process of arranging the display element layer 20. In such an embodiment, the adhesive layer may not be provided between the input sensing layer 40 and the display element layer 20. FIG. 2 shows an embodiment where the input sensing layer 40 is arranged between the display element layer 20 and the optical functional layer 50, but in an alternative embodiment, the input sensing layer 40 may be arranged on the optical functional layer 50.

The optical functional layer 50 may include an anti-reflection layer. The anti-reflection layer may reduce a reflectivity of light incident to the display panel 10 from outside (external light) via the cover window 60. The anti-reflection layer may include a retarder and a polarizer. The retarder may be of a film type or a liquid crystal coating type. The polarizer may be of a film type or a liquid crystal coating type. The film-type polarizer may include a stretched synthetic resin film, and the liquid crystal coating-type polarizer may include liquid crystals arranged in a predetermined orientation.

In an alternative embodiment, the anti-reflection layer may include a black matrix and color filters. The color filters may be arranged taking into account a color of light emitted from each of the light-emitting diodes in the display element layer 20. In another alternative embodiment, the anti-reflection layer may include a destructive interference structure. The destructive interference structure may include a first reflective layer and a second reflective layer arranged on different layers. First reflected light and second reflected light that are respectively reflected by the first reflective layer and the second reflective layer may be destructively interfered with each other, and accordingly a reflectivity of external light may be reduced.

The optical functional layer 50 may include a lens layer. The lens layer may improve the light-emitting efficiency of light emitted from the display element layer 20 or may reduce a color difference. The lens layer may include a layer having a concave or a convex lens shape and/or may include a plurality of layers having different refractive indices. The optical functional layer 50 may include both the anti-reflection layer and the lens layer or may include either the anti-reflection layer or the lens layer.

In an embodiment, an opening 10H is defined through the display panel 10. In such an embodiment, as shown in FIG. 2, first to third openings 20H, 40H, and 50H that overlap one another may be defined through the display element layer 20, the input sensing layer 40, and the optical functional layer 50, respectively.

The first opening 20H may pass (or extend) through a bottom surface from an upper surface of the display element layer 20, the second opening 40H may pass through the bottom surface from an upper surface of the input sensing layer 40, and the third opening 50H may pass through the bottom surface from an upper surface of the optical functional layer 50.

The opening 10H of the display panel 10, e.g., the first to third openings 20H, 40H, and 50H, may overlap one another in the opening area OA. Sizes (or diameters) of the first to third openings 20H, 40H, and 50H may be the same as or different from one another.

In an alternative embodiment, an opening may not be defined through at least one selected from the display element layer 20, the input sensing layer 40, and the optical functional layer 50. In an embodiment, for example, an opening may not be defined through one or two elements selected from the display element layer 20, the input sensing layer 40, and the optical functional layer 50.

The cover window 60 may be on the optical functional layer 50. The cover window 60 may be coupled to the optical functional layer 50 via an adhesive layer such as an optical clear adhesive ("OCA") provided between the cover window 60 and the optical functional layer 50. The cover window 60 may include a glass material or a plastic material. The plastic material may include polyether sulfone, polyacrylate, polyether imide, polyethylene naphthalate, polyethylene terephthalate, polyphenylene sulfide, polyarylate, polyimide, polycarbonate, or cellulose acetate propionate, for example.

The cover window 60 may include a flexible window. In an embodiment, for example, the cover window 60 may include a polyimide window or an ultra-thin glass window.

The opening area OA may be a kind of component area (e.g., a sensor region, a camera region, a speaker region, etc.) in which a component 70 which performs at least one selected from various functions for the display device 1 is located. The component 70 may be provided to overlap the opening 10H of the display panel 10.

The component 70 may include an electronic element. In an embodiment, for example, the component 70 may include an electronic element using light or sound. In an embodiment, for example, the electronic element may include a sensor using light such as an IR sensor, a camera capturing an image by receiving light, a sensor for outputting and sensing light or sound to measure a distance or recognize a fingerprint, a small-sized lamp illuminating light, a speaker for outputting sound, etc. The electronic element using light may use light of various wavelength bands such as visible light, infrared rays, ultraviolet rays, etc. The opening area OA may correspond to a transmission area through which light and/or sound output from the component 70 or proceeding towards the component 70 may pass from the outside.

In an alternative embodiment, where the display device 1 is used in a smart watch or an instrument panel for a vehicle, the component 70 may include a member having a clock needle or a needle indicating predetermined information (e.g., vehicle velocity, etc.). In such an embodiment, an opening may be defined in the cover window 60 to be located in the opening area OA to expose the component 70 such as a needle to outside. Alternatively, where the display device 1 includes the component 70 such as a speaker, an opening may be defined through the cover window 60 to correspond to the opening area OA.

Figure 3:
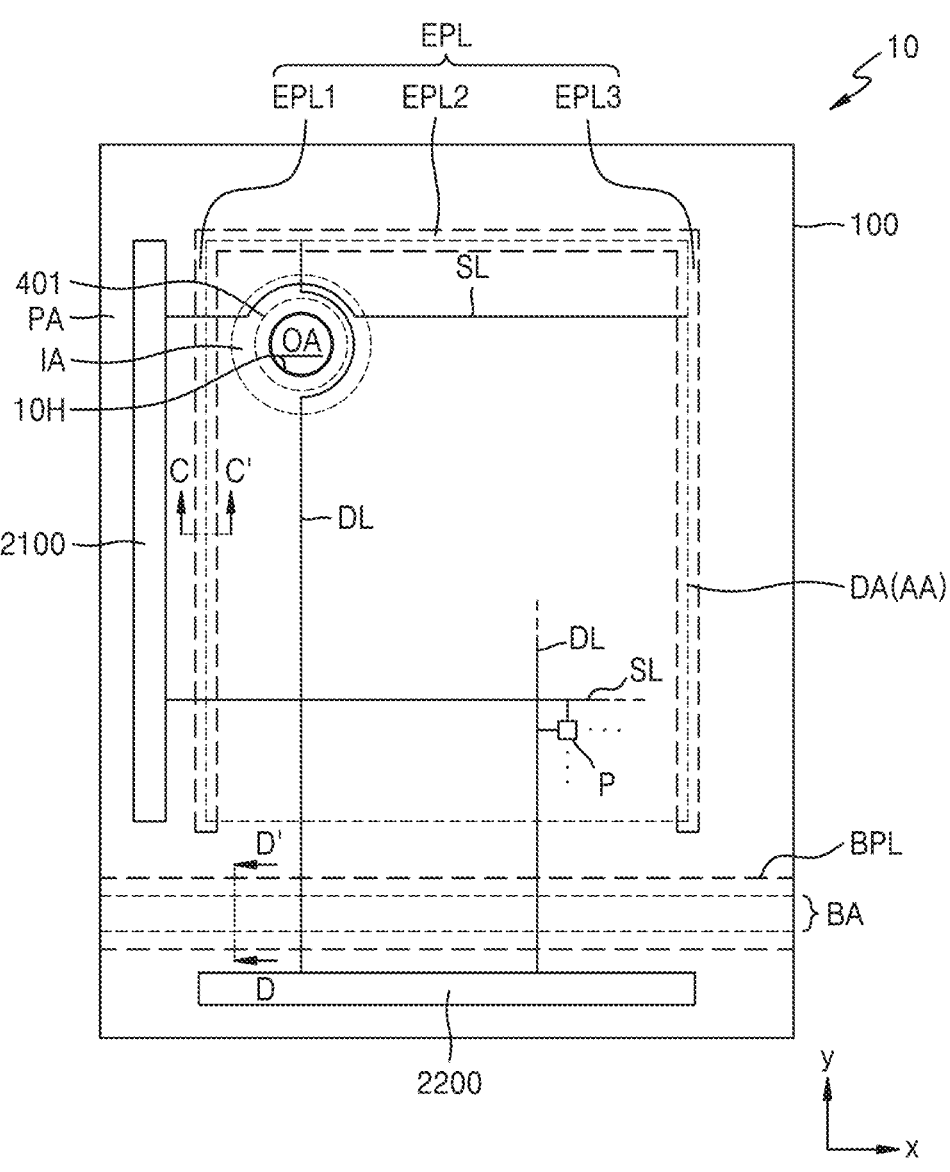
FIG. 3 is a plan view of a display panel according to an embodiment.
Figure 4:
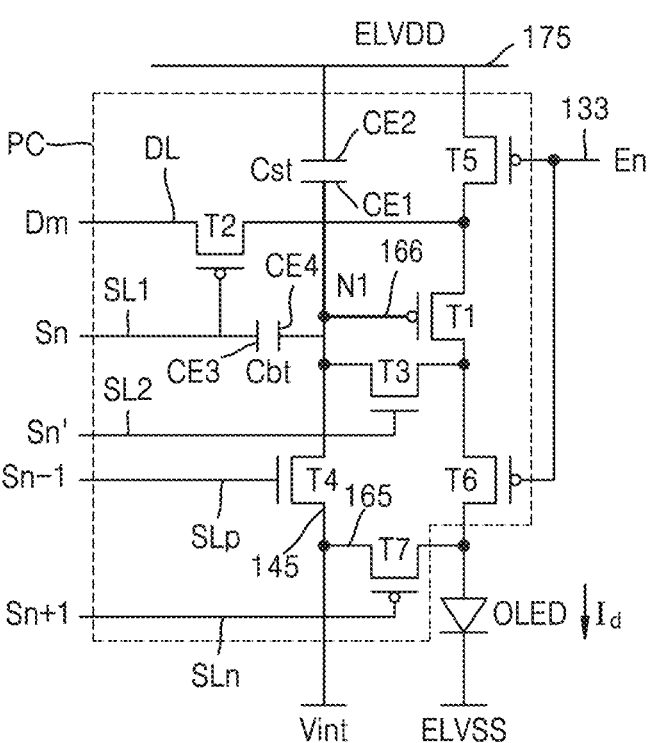
FIG. 4 is a diagram of an equivalent circuit connected to one light-emitting diode of a display panel.

FIG. 3 is a plan view of the display panel 10 according to an embodiment. FIG. 4 is a diagram of an equivalent circuit connected to one light-emitting diode of the display panel 10.

Referring to FIGS. 3 and 4, the display panel 10 may include the opening area OA, the display area DA (or an active area AA), the intermediate area IA, and the peripheral area PA. The display panel 10 includes a plurality of pixels P in the display area DA, and the display panel 10 may display images by using light emitted from a light-emitting diode of each pixel P, e.g., red, green, and blue light.

In an embodiment, the light-emitting diode of each pixel P may include an organic light-emitting diode OLED as shown in FIG. 4, and each organic light-emitting diode OLED may be electrically connected to a pixel circuit PC. FIG. 4 shows an embodiment where the light-emitting diode includes the organic light-emitting diode OLED, but in an alternative embodiment, the display panel 10 may include an inorganic light-emitting diode, instead of the organic light-emitting diode OLED, as described above.

Referring to FIG. 4, an embodiment of the pixel circuit PC may include first to seventh transistors T1, T2, T3, T4, T5, T6, and T7, a storage capacitor Cst, and a boost capacitor Cbt. In an alternative embodiment, the pixel circuit PC may not include the boost capacitor Cbt. Hereinafter, an embodiment of the pixel circuit PC including the boost capacitor Cbt will be described for convenience of description.

Some of the first to seventh transistors T1, T2, T3, T4, T5, T6, and T7 may be n-channel metal-oxide-semiconductor ("NMOS") transistors (e.g., n-channel metal-oxide-semiconductor field effect transistors ("n-MOSFET")) and the others of the first to seventh transistors T1, T2, T3, T4, T5, T6, and T7 may be p-channel metal-oxide-semiconductor ("PMOS") transistors (e.g., p-channel metal-oxide-semiconductor field effect transistors ("p-MOSFET")). In an embodiment, for example, the third and fourth transistors T3 and T4 may be NMOS transistors, and the others may be PMOS transistors. In an alternative embodiment, the third, fourth, and seventh transistors T3, T4, and T7 may be NMOS transistors, and the others may be PMOS transistors. Alternatively, only one of the first to seventh transistors T1, T2, T3, T4, T5, T6, and T7 may be an NMOS transistor, and the others may be PMOS transistors.

The first to seventh transistors T1, T2, T3, T4, T5, T6, and T7, the storage capacitor Cst, and the boost capacitor Cbt may be connected to signal lines. The signal lines may include a first scan line SL1 configured to transfer a first scan signal Sn, a second scan line SL2 configured to transfer a second scan signal Sn', a previous scan line SLp configured to transfer a previous scan signal Sn−1, a light-emitting control line 133 configured to transfer a light-emitting control signal En, a next scan line SLn configured to transfer a next scan signal Sn+1, and a data line DL crossing the first scan line SL1 and configured to transfer a data signal Dm.

A driving voltage line 175 may transfer a driving voltage ELVDD to the first transistor T1, and first and second initialization voltage lines 145 and 165 may transfer an initialization voltage Vint.

The first transistor T1 may be a driving transistor. A first gate electrode (or first control electrode) of the first transistor T1 may be connected to the storage capacitor Cst, a first electrode of the first transistor T1 may be electrically connected to the driving voltage line 175 via the fifth transistor T5, and a second electrode of the first transistor T1 may be electrically connected to a pixel electrode of the organic light-emitting diode OLED via the sixth transistor T6. One of the first and second electrodes of the first transistor T1 may be a source electrode, and the other of the first and second electrodes of the first transistor T1 may be a drain electrode. The first transistor T1 receives a data signal Dm based on a switching operation of the second transistor T2 and may supply a driving current $I_d$ to the organic light-emitting diode OLED.

The second transistor T2 may be a switching transistor. A second gate electrode (or second control electrode) of the second transistor T2 may be connected to the first scan line SL1, a first electrode of the second transistor T2 may be connected to the data line DL, and a second electrode of the second transistor T2 may be connected to the first electrode of the first transistor T1, and at the same time, is electrically connected to the driving voltage line 175 via the fifth transistor T5. One of the first and second electrodes of the second transistor T2 may be a source electrode, and the other may be a drain electrode. The second transistor T2 is turned on in response to the first scan signal Sn transferred through the first scan line SL1 and may perform a switching operation for transferring the data signal Dm transferred via the data line DL to the first electrode of the first transistor T1.

The third transistor T3 may be a compensation transistor for compensating for a threshold voltage of the first transistor T1. A third gate electrode (or compensation control electrode) of the third transistor T3 is connected to the second scan line SL2. A first electrode of the third transistor T3 is connected to a lower electrode CE1 of the storage capacitor Cst and the first gate electrode of the first transistor T1 via a node connecting line 166. The first electrode of the third transistor T3 may be connected to the fourth transistor T4. A second electrode of the third transistor T3 is connected to the second electrode of the first transistor T1, and at the same time, is electrically connected to the pixel electrode of the organic light-emitting diode OLED via the sixth transistor T6. One of the first and second electrodes of the third transistor T3 may be a source electrode, and the other of the first and second electrodes of the third transistor T3 may be a drain electrode.

The third transistor T3 is turned on in response to the second scan signal Sn' transferred through the second scan line SL2, and electrically connects the first gate electrode and the second electrode of the first transistor T1 to diode-connect the first transistor T1.

The fourth transistor T4 may be a first initialization transistor for initializing the first gate electrode of the first transistor T1. A fourth gate electrode (or fourth control electrode) of the fourth transistor T4 is connected to the previous scan line SLp. The first electrode of the fourth transistor T4 is connected to the first initialization voltage line 145. A second electrode of the fourth transistor T4 may be connected to the lower electrode CE1 of the storage capacitor Cst, the first electrode of the third transistor T3, and the first gate electrode of the first transistor T1. One of the first and second electrodes of the fourth transistor T4 may be a source electrode, and the other of the first and second electrodes of the fourth transistor T4 may be a drain electrode. The fourth transistor T4 is turned on in response to the previous scan signal Sn−1 transferred through the previous scan line SLp, and may perform an initialization operation for initializing the voltage at the first gate electrode of the first transistor T1 by transferring the initialization voltage Vint to the first gate electrode of the first transistor T1.

The fifth transistor T5 may be an operation control transistor. A fifth gate electrode (or fifth control electrode) of the fifth transistor T5 is connected to the light-emitting control line 133, a first electrode of the fifth transistor T5 is connected to the driving voltage line 175, and a second electrode of the fifth transistor T5 is connected to the first electrode of the first transistor T1 and the second electrode of the second transistor T2. One of the first and second electrodes of the fifth transistor T5 may be a source electrode, and the other of the first and second electrodes of the fifth transistor T5 may be a drain electrode.

The sixth transistor T6 may be an emission control transistor. A sixth gate electrode (or sixth control electrode) of the sixth transistor T6 is connected to the light-emitting control line 133, a first electrode of the sixth transistor T6 is connected to the second electrode of the first transistor T1 and the second electrode of the third transistor T3, and the second electrode of the sixth transistor T6 is electrically connected to a second electrode of the seventh transistor T7 and the pixel electrode of the organic light-emitting diode OLED. One of the first and second electrodes of the sixth transistor T6 may be a source electrode, and the other of the first and second electrodes of the sixth transistor T6 may be a drain electrode.

The fifth transistor T5 and the sixth transistor T6 are simultaneously turned on in response to the emission control signal En transferred through the light-emitting control line 133 to transfer the driving voltage ELVDD to the organic light-emitting diode OLED and to allow the driving current $I_d$ to flow in the organic light-emitting diode OLED.

The seventh transistor T7 may be a second initialization transistor for initializing the pixel electrode of the organic light-emitting diode OLED. A seventh gate electrode (or seventh control electrode) of the seventh transistor T7 is connected to the next scan line SLn. A first electrode of the seventh transistor T7 is connected to the second initialization voltage line 165. A second electrode of the seventh transistor T7 is connected to the second electrode of the sixth transistor T6 and the pixel electrode of the organic light-emitting diode OLED. The seventh transistor T7 is turned on in response to a next scan signal Sn+1 transferred through the next scan line SLn to initialize the pixel electrode of the organic light-emitting diode OLED. FIG. 4 shows an embodiment where the seventh transistor T7 is connected to the next scan line SLn, but alternatively, the seventh transistor T7 may be connected to the light-emitting control line 133 and may be driven based on the light-emitting control signal En.

The storage capacitor Cst includes the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line 175. The storage capacitor Cst may store charges corresponding to a difference between the voltage at the first gate electrode of the first transistor T1 and the driving voltage ELVDD.

The boost capacitor Cbt includes a third electrode CE3 and a fourth electrode CE4. The third electrode CE3 is connected to the second gate electrode of the second transistor T2 and the first scan line SL1, and the fourth electrode CE4 may be connected to the first electrode of the third transistor T3 and the node connection line 166. When the first scan signal Sn supplied to the first scan line SL1 is turned off, the boost capacitor Cbt may increase the voltage at the first node N1. When the voltage at the first node N1 is increased, black gray scale may be clearly expressed.

The first node N1 may be a region where the first gate electrode of the first transistor T1, the first electrode of the third transistor T3, the second electrode of the fourth transistor T4, and the fourth electrode CE4 of the boost capacitor Cbt are connected to each other.

In an embodiment, as shown in FIG. 4, the third and fourth transistors T3 and T4 are NMOS transistors, and the first, second, and fifth to seventh transistors T1, T2, T5, T6, and T7 are PMOS transistors. The first transistor T1 that directly affects a brightness of the display device includes a semiconductor layer including polycrystalline silicon having high reliability, and as such, the display device having high resolution may be implemented.

Referring back to FIG. 3, the intermediate area IA may surround the opening area OA. The intermediate area IA is an area in which the display element such as an organic light-emitting diode emitting light is not arranged, and signal lines for providing signals to the pixels P around the first area OA may pass through the intermediate area IA. In an embodiment, for example, the data lines DL and/or the scan lines SL cross the display area DA in the y-direction and/or the x-direction as shown in FIG. 3, and in the intermediate area IA, some parts of the data lines DL and/or scan lines SL may extend or curve along an edge of the opening 10H of the display panel 10 defined or formed in the opening area OA.

The peripheral area PA may include a scan driver 2100 for providing each pixel P with a scan signal, a data driver 2200 for providing each pixel P with a data signal, and a main power line (not shown) and a second main power line (not shown) for supplying a first power voltage (driving voltage) ELVDD (see FIG. 4) and a second power voltage ELVSS (see FIG. 4). FIG. 3 shows an embodiment where the data driver 2200 is adjacent to one side of the substrate 100, but in an alternative embodiment, the data driver 2200 may be on a printed circuit board that is electrically connected to a pad at one side of the display panel 10. The printed circuit board may be flexible, and may be partially curved to be under the rear surface of the substrate 100.

In an embodiment, for example, the display panel 10 may include a bending area BA between the portion where the display area DA is provided and the portion where the data driver 2200 is provided. The bending area BA may include a bending axis and the substrate 100 may be bent about the bending axis. In such an embodiment, the display panel 10 may include protective layers in various portions. In an embodiment, for example, the display panel 10 may include an edge protective layer EPL on a boundary portion of the display area DA. The edge protective layer EPL may be provided along the boundary of the display area DA. In an embodiment, the edge protective layer EPL may be integrally provided with each other as a single unitary unit or at least two edge protective layers EPL may be provided. In an embodiment, for example, where the edge protective layer EPL is integrally provided with each other, the edge protective layer EPL may have a 'Π'-like shape and may have the display area DA at the center. In an alternative embodiment, where at least two edge protective layers EPL are provided, the edge protective layers EPL may be arranged to be spaced apart from each other. In such an embodiment, the at least two edge protective layers EPL may be arranged to be spaced apart from each other. In such an embodiment, ends of the adjacent edge protective layers EPL may be spaced apart from each other. In such an embodiment, the at least two edge protective layers EPL may be arranged along the boundary of the display area DA. The edge protective layer EPL may each have various shapes. In an embodiment, for example, one edge protective layer EPL may have an 'L'-like shape, and another edge protective layer EPL may have a straight shape. In an alternative embodiment, the plurality of edge protective layers EPL may have the straight shapes, and the plurality of edge protective layers EPL may be arranged to be spaced apart from one another along the boundary of the display area DA. In this case, one of the plurality of edge protective layers EPL is arranged on one of the boundaries of the display area DA, another of the plurality of the edge protective layers EPL is arranged on another boundary of the display area DA, and the other of the plurality of the edge protective layers EPL may be arranged on another boundary of the display area DA. Here, the plurality of edge protective layers EPL may surround the display area DA. In another alternative embodiment, there may be a plurality of edge protective layers EPL, and each of the plurality of the edge protective layers EPL may be arranged on a corresponding one of the boundaries of the display area DA. In such an embodiment, the plurality of edge protective layers EPL arranged on the boundaries of the display area DA, respectively, may be arranged to be as close as possible to one another, and at the same time, to be spaced apart from one another. The plurality of edge protective layers EPL may be arranged along boundaries of the display area DA, respectively. Hereinafter, an embodiment in which the edge protective layer EPL is integrally provided with each other as a single unitary unit will be described below in detail for convenience of description.

In an embodiment, the edge protective layer EPL may include acryl.

In an embodiment, the edge protective layer EPL may include a first edge protective layer EPL1, a second edge protective layer EPL2, and a third edge protective layer EPL3. In such an embodiment, the first edge protective layer EPL1, the second edge protective layer EPL2, and the third edge protective layer EPL3 may be connected to one another.

A bending protective layer BPL may be on the peripheral area PA. In an embodiment, the bending protective layer BPL may cover the bending area BA of the display panel 10. In such an embodiment, a width (e.g., a length measured in the y-direction of FIG. 3) of the bending protective layer BPL may be greater than a width of the bending area BA. In such an embodiment, the bending area BA may be in the bending protective layer BPL when viewed from a plan view. In an embodiment, the bending protective layer BPL may include a polymer resin such as polyethylene tereph-thalate ("PET"), polyimide ("PI"), etc.

A planarized insulating layer 401 may be provided around the opening area OA as a protective layer. The planarized insulating layer 401 may surround the periphery of the opening area OA. The planarized insulating layer 401 may have a ring-shape. in an embodiment, the planarized insu-lating layer 401 may include a polymer-based material. In an embodiment, for example, the planarized insulating layer 401 may include a silicon-based resin, an acryl-based resin, an epoxy-based resin, PI, polyethylene, etc.

One of the edge protective layer EPL, the bending pro-tective layer BPL, and the planarized insulating layer 401 and another of the edge protective layer EPL, the bending protective layer BPL, and the planarized insulating layer 401 may include different materials from each other.

Figure 5:
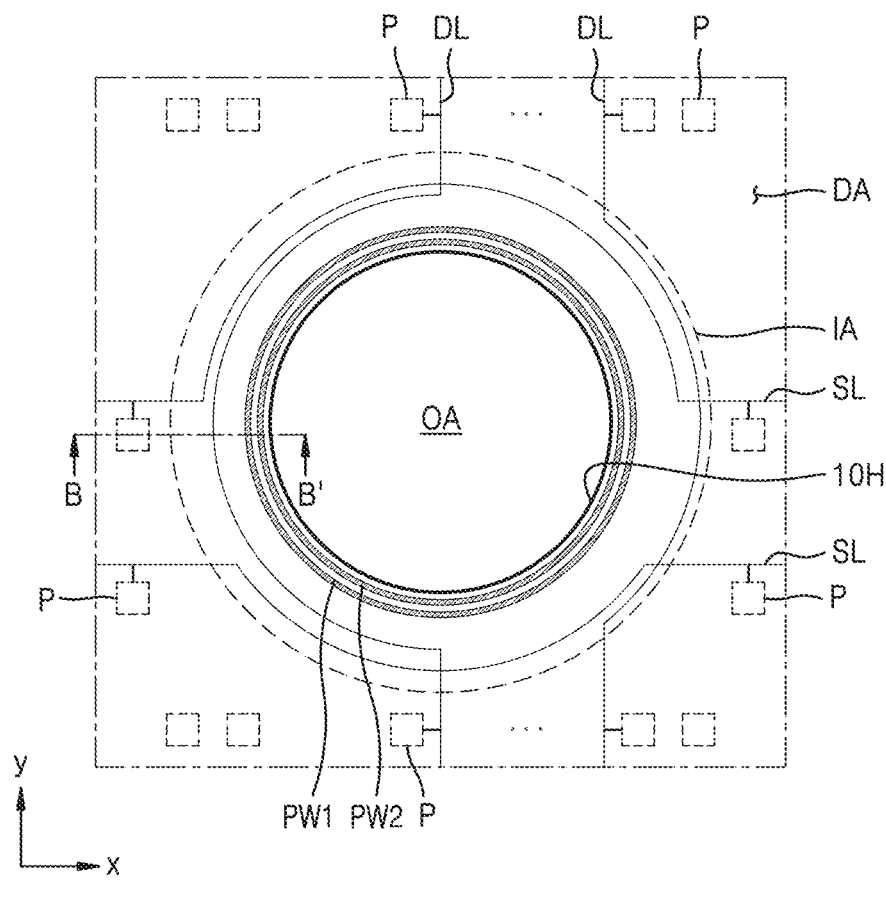
FIG. 5 is a plan view showing part of a display panel according to an embodiment.

FIG. 5 is a plan view showing part of a display panel according to an embodiment.

Referring to FIG. 5, in an embodiment, pixels P are in the display area DA, and the intermediate area IA may be between the opening area OA and the display area DA. The pixels P that are adjacent to the opening area OA may be spaced apart from one another around the opening area OA on a plane. As shown in the plan view of FIG. 5, the pixels P may be spaced apart from one another on upper and lower parts of the opening area OA, or may be spaced apart from one another on left and right sides of the opening area OA. Each of the pixels P uses the red light, green light, and blue light emitted from the light-emitting diode, and locations of the pixels P in FIG. 5 correspond to locations of the light-emitting diodes. Therefore, that "the pixels P are spaced apart from one another around the opening area OA on the plane" may denote that "the light-emitting diodes are spaced apart from one another around the opening area OA on the plane (or in the plan view)". In an embodiment, for example, on the plane, the light-emitting diodes may be spaced apart from one another on upper and lower parts of the opening area OA, or may be spaced apart from one another on left and right sides of the opening area OA.

From among the signal lines for supplying signals to the pixel circuit connected to the light-emitting diode of each pixel P, signal lines adjacent to the opening area OA may curve around the opening area OA and/or the opening 10H. Some of the data lines DL passing through the display area DA extend in ±y directions to provide data signals to the pixels P arranged above and under the opening area OA, and may curve along an edge of the opening area OA and/or the opening 10H in the intermediate area IA. Some of the scan lines SL passing through the display area DA extend in ±x directions to provide scan signals to the pixels P arranged at left and right sides of the opening area OA, and may curve along an edge of the opening area OA and/or the opening 10H in the intermediate area IA.

FIG. 5 shows an embodiment where the scan lines SL curve around the opening area OA and/or the opening 10H in the intermediate area IA, but one or more embodiments are not limited thereto. In an alternative embodiment, the scan lines SL may be separated or disconnected at the opening area OA and/or the opening 10H. The scan lines SL at the left side of the opening area OA and/or the opening 10H may receive signals from the scan driver 2100 at the left side of the display area DA as shown in FIG. 3, and the scan lines SL at the right side of the opening area OA and/or the opening 10H may receive the signals from an additional scan driver that is opposite to the scan driver 2100 based on the display area DA, although not shown in FIG. 3.

In an embodiment, at least one barrier wall that is closer to the opening area OA than the curved parts of the signal lines may be provided in the intermediate area IA. In such an embodiment, as shown in FIG. 5, the at least one barrier wall may include first and second barrier walls PW1 and PW2. The first and second barrier walls PW1 and PW2 have closed loop shapes surrounding the opening area OA and/or the opening 10H, and may be spaced apart from each other in the intermediate area IA.

Figure 6:
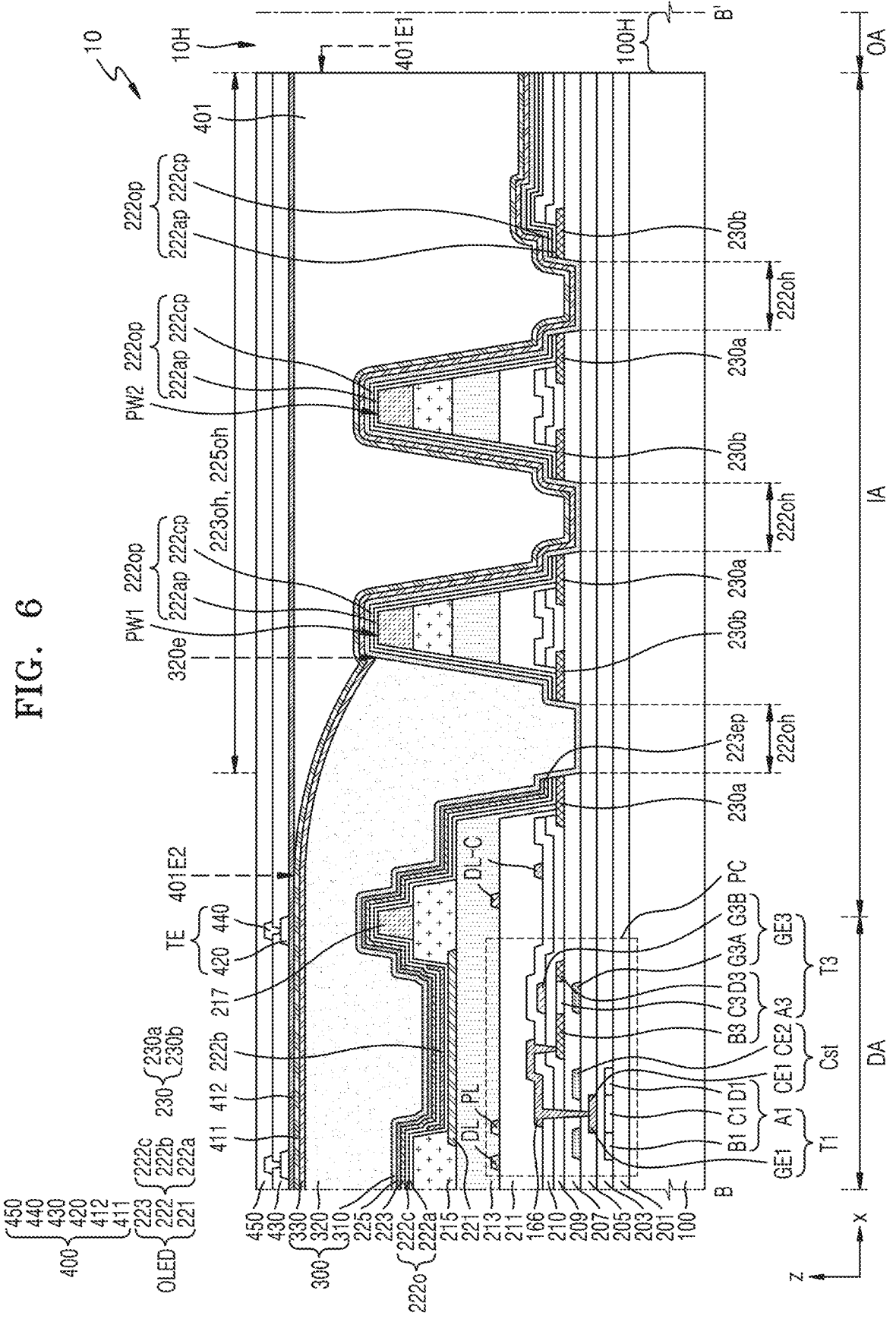
FIG. 6 is a cross-sectional view of the display panel of FIG. 5 taken along line B-B' of FIG. 5, according to an embodiment.

FIG. 6 is a cross-sectional view of the display panel of FIG. 5 taken along line B-B' of FIG. 5, according to an embodiment.

Referring to FIG. 6, an embodiment of the display panel 10 may include the opening 10H defined in the opening area OA. The opening 10H may be a through hole that penetrates through upper and lower surfaces of the display panel 10.

In an embodiment where the display panel 10 includes the opening 10H in the opening area OA, a plurality of layers included in the display panel 10 may also include openings in the opening area OA. The substrate 100 may include an opening 100H in the opening area OA, and the opening 100H of the substrate 100 is defined by a through hole formed or defined in the substrate 100, e.g., extending from the upper to lower surfaces of the substrate 100.

In the display area DA of FIG. 6, the pixel circuit PC is on the substrate 100, and the organic light-emitting diode OLED may be on the pixel circuit PC.

The substrate 100 may include a glass material or a polymer resin. In an embodiment, for example, the polymer resin may include at least one selected from polyether sulfone, polyacrylate, polyether imide, polyethylene naphthalate, polyethylene terephthalate, polyphenylene sulfide, polyarylate, polyimide, polycarbonate, and cellulose acetate propionate, for example. The substrate 100 including the polymer resin may be flexible, rollable, or bendable. The substrate 100 may have a multi-layered structure including a layer including the polymer resin and an inorganic layer (not shown).

A buffer layer 201 may be on the upper surface of the substrate 100. The buffer layer 201 may prevent impurities from infiltrating into a semiconductor layer of a transistor (e.g., Thin Film Transistor (TFT)). The buffer layer 201 may include an inorganic insulating material such as silicon nitride, silicon oxynitride, and silicon oxide, and may have a single-layered or multi-layered structure, each layer therein including at least one selected from the inorganic insulating materials stated above.

The pixel circuit PC may be on the buffer layer 201. The pixel circuit PC may include the plurality of transistors and the storage capacitor, as described above with reference to FIG. 4. FIG. 6 shows the first transistor T1, the third transistor T3, and the storage capacitor Cst.

The first transistor T1 may include a semiconductor layer (hereinafter, referred to as a first semiconductor layer A1) on the buffer layer 201, and a gate electrode (hereinafter, referred to as a first gate electrode GE1) overlapping a channel region C1 of the first semiconductor layer A1. The first semiconductor layer A1 may include a silicon-based semiconductor material, e.g., polysilicon. The first semiconductor layer A1 may include the channel region C1, and a first region B1 and a second region D1 on opposite sides of the channel region C1. The first and second regions B1 and D1 include impurities of higher concentration than that of the channel region C1, and one of the first and second regions B1 and D1 may correspond to a source region and the other may correspond to a drain region.

A first gate insulating layer 203 may be between the first semiconductor layer A1 and the first gate electrode GE1. The first gate insulating layer 203 may include an inorganic insulating material such as silicon oxide, silicon nitride, and silicon oxynitride, and may have a single-layered or multi-layered structure, each layer therein including at least one selected from the above-stated inorganic insulating materials.

The first gate electrode GE1 may include a conductive material including molybdenum (Mo), aluminum (Al), copper (Cu), titanium (Ti), etc., and may have a single-layered or multi-layered structure, each layer therein including at least one selected from the above-stated conductive materials.

The storage capacitor Cst may include a lower electrode CE1 and an upper electrode CE2 overlapping each other. In an embodiment, the lower electrode CE1 of the storage capacitor Cst may include the first gate electrode GE1. In such an embodiment, the first gate electrode GE1 may include the lower electrode CE1 of the storage capacitor Cst. In an embodiment, for example, the first gate electrode GE1 and the lower electrode CE1 of the storage capacitor Cst may be integrally provided or formed with each other as a single unitary unit.

A first interlayer insulating layer 205 may be between the lower electrode CE1 and the upper electrode CE2 of the storage capacitor Cst. The first interlayer insulating layer 205 may include an inorganic insulating material such as silicon oxide, silicon nitride, and silicon oxynitride, and may have a single-layered or multi-layered structure, each layer therein including at least one selected from the above-stated inorganic insulating materials.

The upper electrode CE2 of the storage capacitor Cst may have a single-layered or multi-layered structure, each layer therein including a low-resistive conductive material such as molybdenum (Mo), aluminum (Al), copper (Cu), and/or titanium (Ti).

A second interlayer insulating layer 207 may be on the storage capacitor Cst. The second interlayer insulating layer 207 may include an inorganic insulating material such as silicon oxide, silicon nitride, and silicon oxynitride, and may have a single-layered or multi-layered structure, each layer therein including at least one selected from the above-stated inorganic insulating materials.

A semiconductor layer (hereinafter, referred to as a third semiconductor layer A3) of the third transistor T3 may be on the second interlayer insulating layer 207. The third semiconductor layer A3 may include an oxide-based semiconductor material. In an embodiment, for example, the third semiconductor layer A3 may include Zn-oxide based material, e.g., Zn oxide, In—Zn oxide, Ga—In—Zn oxide, etc. In some embodiments, the third semiconductor layer A3 may include In—Ga—Zn—O ("IGZO"), In—Sn—Zn—O ("ITZO"), or In—Ga—Sn—Zn—O ("IGTZO") semiconductor including ZnO with metal such as indium (In), gallium (Ga), and tin (Sn).

The third semiconductor layer A3 may include a channel region C3, and a first region B3 and a second region D3 on opposite sides of the channel region C3. One of the first region B3 and the second region D3 may correspond to a source region and the other may correspond to a drain region.

The third transistor T3 may include a gate electrode (hereinafter, a third gate electrode GE3) overlapping the channel region C3 of the third semiconductor layer A3. The third gate electrode GE3 may have a dual-gate structure including a lower gate electrode G3A under the third semiconductor layer A3, and an upper gate electrode G3B on the channel region C3.

The lower gate electrode G3A may be in a layer (e.g., directly on a first interlayer insulating layer 205) that is the same as the upper electrode CE2 of the storage capacitor Cst, that is, the lower gate electrode G3A and the upper electrode CE2 of the storage capacitor Cst are in a same layer (or directly on a same layer) as each other. The lower gate electrode G3A may include a same material as that of the upper electrode CE2 of the storage capacitor Cst.

The upper gate electrode G3B may be on the third semiconductor layer A3 with the second gate insulating layer 209 therebetween. The second gate insulating layer 209 may include an inorganic insulating material such as silicon oxide, silicon nitride, and silicon oxynitride, and may have a single-layered or multi-layered structure, each layer therein including at least one selected from the above-stated inorganic insulating materials.

The third interlayer insulating layer 210 may be on the upper gate electrode G3B. The third interlayer insulating layer 210 may include an inorganic insulating material such as silicon oxynitride, and may have a single-layered or multi-layered structure, each layer therein including the inorganic insulating material.

FIG. 6 shows an embodiment where the upper electrode CE2 of the storage capacitor Cst is in a same layer as the lower gate electrode G3A of the third gate electrode GE3, but one or more embodiments are not limited thereto. In an alternative embodiment, the upper electrode CE2 of the storage capacitor Cst may be in a same layer as the third semiconductor layer A3, and may include a same material as that of the first region B3 and the second region D3 of the third semiconductor layer A3.

The first transistor T1 and the third transistor T3 may be electrically connected to each other via a node connecting line 166. The node connecting line 166 may be on the third interlayer insulating layer 210. A side of the node connecting line 166 may be connected to the first gate electrode GE1 of the first transistor T1, and the other side of the node connecting line 166 may be connected to the third semiconductor layer A3 of the third transistor T3.

The node connecting line 166 may include aluminum (Al), copper (Cu), and/or titanium (Ti), and may have a single-layered or multi-layered structure, each layer therein including at least one selected from the above stated materials. In an embodiment, for example, the node connecting line 166 may have a triple-layered structure including titanium layer/aluminum layer/titanium layer.

A first organic insulating layer 211 may be on the node connecting line 166. The first organic insulating layer 211 may include an organic insulating material. The organic insulating material may include acryl, benzocyclobutene ("BCB"), polyimide, hexamethyldisiloxane ("HMDSO"), etc.

The data line DL and the driving voltage line PL may be on the first organic insulating layer 211, and may be covered by a second organic insulating layer 213. The data line DL and the driving voltage line PL may each include aluminum (Al), copper (Cu), and/or titanium (Ti), and may have a single-layered or multi-layered structure, each layer therein including at least one selected from the above-stated materials. In an embodiment, for example, the data line DL and the driving voltage line PL may have a triple-layered structure including titanium layer/aluminum layer/titanium layer.

The second organic insulating layer 213 may include an organic insulating material such as acryl, BCB, polyimide, and/or HMDSO. FIG. 6 shows an embodiment where the data line DL and the driving voltage line PL are on the first organic insulating layer 211, but one or more embodiments are not limited thereto. In an alternative embodiment, one of the data line DL and the driving voltage line PL may be in a same layer as the node connecting line 166, e.g., on the third interlayer insulating layer 210.

In an embodiment, the first electrode 221 of the organic light-emitting diode OLED may include a reflective layer including argentum (Ag), magnesium (Mg), aluminum (Al), platinum (Pt), palladium (Pd), aurum (Au), nickel (Ni), neodymium (Nd), iridium (Ir), chrome (Cr), or a compound thereof. In an alternative embodiment, the first electrode 221 may further include a conductive oxide layer on and/or under the reflective layer. The conductive oxide layer may include indium tin oxide ("ITO"), indium zinc oxide ("IZO"), zinc oxide (ZnO), indium oxide ($In_2O_3$), indium gallium oxide, and/or aluminum zinc oxide ("AZO"). In an embodiment, the first electrode 221 may have a triple-layered structure including ITO layer/Ag layer/ITO layer.

A bank layer 215 may be on the first electrode 221. In an embodiment, an opening may be defined through the bank layer 215 to overlap the first electrode 221, and the bank layer 215 may cover edges of the first electrode 221. The bank layer 215 may include an organic insulating material such as polyimide.

A spacer 217 may be on the bank layer 215. The spacer 217 may be formed simultaneously with the bank layer 215 through a same process, or may be independently formed through a separate process. In an embodiment, the spacer 217 may include an organic insulating material such as polyimide. Alternatively, the bank layer 215 may include an organic insulating material containing light-shielding dye, and the spacer 217 may include an organic insulating material such as polyimide.

An intermediate layer 222 includes an emission layer 222b. The intermediate layer 222 may include a first functional layer 222a under the emission layer 222b and/or a second functional layer 222c on the emission layer 222b. The emission layer 222b may include a polymer or low-molecular weight organic material emitting predetermined color light. The second functional layer 222c may include an electron transport layer ("ETL") and/or an electron injection layer ("EIL"). The first functional layer 222a and the second functional layer 222c may each include an organic material.

The second electrode 223 may include a conductive material having a low work function. In an embodiment, for example, the second electrode 223 may include a (semi-) transparent layer including Ag, Mg, Al, Pt, Pd, Au, Ni, Nd, Ir, Cr, lithium (Li), calcium (Ca), or an alloy thereof. Alternatively, the second electrode 223 may further include a layer including ITO, IZO, ZnO, or $In_2O_3$ on the (semi-) transparent layer including at least one selected from the above materials.

The emission layer 222b may be on the display area DA to overlap the first electrode 221 via the opening in the bank layer 215. However, the organic material layer included in the intermediate layer 222, e.g., the first functional layer 222a and the second functional layer 222c, may entirely cover the display area DA. The second electrode 223 may also entirely cover the display area DA.

A capping layer 225 may be on the second electrode 223. The capping layer 225 may include an inorganic material or an organic material. The capping layer 225 may include LiF, an inorganic insulating material, and/or an organic insulating material. The capping layer 225 may entirely cover the display area DA.

The organic light-emitting diode OLED including the first electrode 221, the intermediate layer 222, and the second electrode 223 may be covered by an encapsulation layer 300. The encapsulation layer 300 may include at least one organic encapsulation layer and at least one inorganic encapsulation layer. In an embodiment, FIG. 6 shows that the encapsulation layer 300 includes first and second inorganic encapsulation layers 310 and 330 and an organic encapsulation layer 320 disposed between the first and second inorganic encapsulation layers 310 and 330. The encapsulation layer 300 may be on the capping layer 225.

The first and second inorganic encapsulation layers 310 and 330 may include at least one inorganic material selected from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each have a single-layered structure or a multi-layered structure, each layer therein including at least one selected from the above-mentioned materials. The organic encapsulation layer 320 may include a polymer-based material. The polymer-based material may include an acryl-based resin, an epoxy-based resin, polyimide, polyethylene, etc. In an embodiment, the organic encapsulation layer 320 may include acrylate.

The first inorganic encapsulation layer 310 and the second inorganic encapsulation layer 330 may have different thicknesses from each other. The thickness of the first inorganic encapsulation layer 310 may be greater than that of the second inorganic encapsulation layer 330. Alternatively, the thickness of the second inorganic encapsulation layer 330 may be greater than that of the first inorganic encapsulation layer 310, or the first inorganic encapsulation layer 310 and the second inorganic encapsulation layer 330 may have a same thickness as each other.

An input sensing layer 400 may be on the encapsulation layer 300. The input sensing layer 400 may include touch electrodes TE in the display area DA, and at least one touch insulating layer. FIG. 6 shows an embodiment where the input sensing layer 400 includes a first touch insulating layer 411 on the second inorganic encapsulation layer 330, a second touch insulating layer 412, a first conductive line 420, a third touch insulating layer 430 on the first conductive line 420, a second conductive line 440 on the third touch insulating layer 430, and a fourth touch insulating layer 450 on the second conductive line 440.

The first touch insulating layer 411, the second touch insulating layer 412, the third touch insulating layer 430, and the fourth touch insulating layer 450 may each include an inorganic insulating material and/or an organic insulating material. In an embodiment, the first touch insulating layer 411, the second touch insulating layer 412, and the third touch insulating layer 430 may each include an inorganic insulating material such as silicon oxide, silicon nitride, and/or silicon oxynitride, and the fourth touch insulating layer 450 may include an organic insulating material.

In an embodiment, a touch electrode TE of the input sensing layer 400 may include a structure to which the fist conductive line 420 and the second conductive line 440 are connected. Alternatively, the touch electrode TE may include one of the first conductive line 420 and the second conductive line 440, and in such an embodiment, the third touch insulating layer 430 may be omitted.

The first conductive line 420 and the second conductive line 440 may each include aluminum (Al), copper (Cu), and/or titanium (Ti), and may have a single-layered or multi-layered structure, each layer therein including at least one selected from the above-stated materials. In an embodiment, for example, the first conductive line 420 and the second conductive line 440 may each have a triple-layered structure including titanium layer/aluminum layer/titanium layer.

In the intermediate area IA of FIG. 6, the first organic insulating layer 211 and the second organic insulating layer 213 may extend to the intermediate area IA. Each of the first organic insulating layer 211 and the second organic insulating layer 213 may be spaced apart from a first barrier wall PW1 that will be described later.

In the intermediate area IA, curved portions DL-C of the data lines may be in different layers from each other with the first organic insulating layer 211 therebetween. One of the neighboring curved portions DL-C of the data lines may be on the first organic insulating layer 211 and the other may be under the first organic insulating layer 211. The curved portions DL-C of the data lines shown in FIG. 6 correspond to portions (curved portions along the opening area OA in FIG. 5), which are in the intermediate area IA, of the data line DL as described above with reference to FIG. 5.

At least one barrier wall is in the intermediate area IA. In an embodiment, FIG. 6 shows an embodiment where two barrier walls are in the intermediate area IA, but in an alternative embodiment, three or more barrier walls may be provided in the intermediate area IA.

The first barrier wall PW1 and the second barrier wall PW2 are in the intermediate area IA, and may be spaced apart from each other in a direction from the display area DA toward the opening area OA. The first barrier wall PW1 is closest to the display area DA, and the second barrier wall PW2 may be closer to the opening area OA than the first barrier wall PW1. The first barrier wall PW1 and the second barrier wall PW2 may each have a closed loop shape surrounding the opening 10H as shown in FIG. 5.

In embodiments of FIG. 6 and embodiments that will be described later, because an opening 100H is defined or formed in the substrate 100 to correspond to the opening 10H in the display panel 10, "the opening area OA", "the opening 10H of the display panel 10", and "the opening 100H of the substrate 100" may be interchangeably used. In an embodiment, for example, "surrounding the opening 10H of the display panel 10" may denote "surrounding the opening 100H of the substrate 100" and/or "surrounding the opening area OA".

The first barrier wall PW1 and the second barrier wall PW2 may include an insulating material. In an embodiment, for example, the first barrier wall PW1 and the second barrier wall PW2 may include an organic insulating material, and may be formed simultaneously in the process of forming a plurality of insulating material layers in the display area DA.

The first barrier wall PW1 and the second barrier wall PW2 may have a same height as each other or different heights from each other. In an embodiment, as shown in FIG. 6, the first barrier wall PW1 and the second barrier wall PW2 may have a same height as each other, but in an alternative embodiment, the first barrier wall PW1 and the second barrier wall PW2 may have different heights from each other.

The one or more barrier walls, e.g., the first barrier wall PW1 and the second barrier wall PW2, may control a flow of the material included in the organic encapsulation layer 320 in the process of forming the encapsulation layer 300. In an embodiment, for example, the organic encapsulation layer 320 may be formed by applying a monomer on the display area DA through an inkjet process and hardening the monomer, and the barrier walls control the flow of the monomer to control the location of the organic encapsulation layer 320. FIG. 6 shows an embodiment where an edge 320e of the organic encapsulation layer 320 is at one side of the first barrier wall PW1. In an alternative embodiment, the edge 320e of the organic encapsulation layer 320 is on the upper surface of the first barrier wall PW1, and thus, the organic encapsulation layer 320 may partially overlap the upper surface of the first barrier wall PW1.

Because the edge 320e of the organic encapsulation layer 320 is at one side of one barrier wall, e.g., the first barrier wall PW1, the second inorganic encapsulation layer 330 may be in direct contact with the first inorganic encapsulation layer 310 in the intermediate area IA. In an embodiment, for example, the first and second inorganic encapsulation layers 310 and 330 may be in direct contact with each other in a region between the edge 320e of the organic encapsulation layer 320 and the opening 10H of the display panel 10. In an embodiment, as shown in FIG. 6, the first inorganic encapsulation layer 310 and the second inorganic encapsulation layer 330 are in direct contact with each other in the region between the first barrier wall PW1 and the opening 10H of the display panel 10.

Insulating layers of the input sensing layer 400, e.g., the first touch insulating layer 411, the second touch insulating layer 412, the third touch insulating layer 430, and the fourth touch insulating layer 450, may extend to cover the intermediate area IA.

A planarized insulating layer 401 may be provided to cover the intermediate area IA. The planarized insulating layer 401 may be only in the intermediate area IA to have a width from a first edge 401E1 to a second edge 401E2. Therefore, the planarized insulating layer 401 may have a closed loop shape (e.g., a donut shape) surrounding the opening 10H on a plane.

The first edge 401E1 of the planarized insulating layer 401 may face the opening 10H of the display panel 10, and the second edge 401E2 of the planarized insulating layer 401 may be adjacent to the display area DA. A part of the planarized insulating layer 401, which is adjacent to the display area DA, may overlap a part of the organic encapsulation layer 320 while covering the edge 320e of the organic encapsulation layer 320, and the second inorganic encapsulation layer 330 and the first touch insulating layer 411 may be interposed between the organic encapsulation layer 320 and the planarized insulating layer 401 in a thickness direction (z-direction) of the display panel 10. in an embodiment, although not shown in the drawings, the second inorganic encapsulation layer 330, the first touch insulating layer 411, and the second touch insulating layer 412 may be between the organic encapsulation layer 320 and the planarized insulating layer 401. Hereinafter, an embodiment in which the second inorganic encapsulation layer 330 and the first touch insulating layer 411 are between the organic encapsulation layer 320 and the planarized insulating layer 401 will be described in detail below for convenience of description.

Although the first touch insulating layer 411 and the second touch insulating layer 412 may be in direct contact with each other in the display area DA, the first touch insulating layer 411 and the second touch insulating layer 412 may be spaced apart from each other in the intermediate area IA due to the planarized insulating layer 401 interposed therebetween in the thickness direction (z-direction).

At least one organic material layer 222o included in the intermediate layer 222 is formed to entirely cover the display area DA, and may provide a proceeding path of moisture that may be introduced through the opening 10H of the display panel 10. In an embodiment, because the organic material layer 222o includes an opening (hereinafter, a first opening 222oh) in the intermediate area IA, proceeding of the moisture via the organic material layer 222o may be prevented or minimized.

The organic material layer 222o may include separate portions 222op spaced apart from each other in the intermediate area IA due to the first opening 222oh. In an embodiment where the organic material layer 222o includes the first functional layer 222a and the second functional layer 222c, the separate portions 222op of the organic material layer 222o may include a part 222ap of the first functional layer 222a and a part 222cp of the second functional layer 222c, which overlap each other.

In an embodiment where the organic material layer 222o includes the first functional layer 222a and the second functional layer 222c, an opening of the first functional layer 222a and an opening of the second functional layer 222c overlap each other and form the first opening 222oh described above.

The first opening 222oh of the organic material layer 222o is formed by a lift-off process using a sacrificial layer. Here, the sacrificial layer may include the gate electrode of the transistor included in the pixel circuit PC and one selected from the electrodes of the storage capacitor Cst. The above sacrificial layer may be covered by at least one insulating layer during the manufacturing process, and under the first opening 222oh of the organic material layer 222o formed through the laser lift-off process, an opening formed in at least one insulating layer may be provided.

A stopper layer 230 may be provided between the organic material layer 222o and at least one insulating layer (e.g., the second interlayer insulating layer 207) in the intermediate area IA. The stopper layer 230 may prevent unintentional etching of a part of insulating layers (insulating layer under the stopper layer 230) and/or a part of the substrate 100 from another etching process performed before the lift-off process described above.

The stopper layer 230 may include an opening corresponding to the first opening 222oh of the organic material layer 222o. The stopper layer 230 may include a first portion 230a and a second portion 230b that are at opposite sides of the opening. The portions of the organic material layer 222o, which are at the opposite sides of the first opening 222oh, may be immediately above the first portion 230a and the second portion 230b of the stopper layer 230, respectively.

The first interlayer insulating layer 205 may be exposed through the first opening 222oh of the organic material layer 222o, the opening of the stopper layer 230, and the opening of the second interlayer insulating layer 207, and the first inorganic encapsulation layer 310 may be in direct contact with the first interlayer insulating layer 205. The first interlayer insulating layer 205 may include an inorganic insulating material, and the contact between the first inorganic encapsulation layer 310 and the first interlayer insulating layer 205 may locally block the proceeding of the moisture.

In an embodiment, the first openings 222oh of the organic material layer 222o may be spaced apart from each other in the intermediate area IA as shown in FIG. 6. In such an embodiment, as shown in FIG. 6, the first opening 222oh between the first barrier wall PW1 and the display area DA, the first opening 222oh between the first barrier wall PW1 and the second barrier wall PW2, and the first opening 222oh between the second barrier wall PW2 and the opening 10H, and structures under the first openings 222oh may be spaced apart from one another in the intermediate area IA.

Each of the first openings 222oh may extend along the edge of the opening 10H, and may have a closed loop shape entirely surrounding the opening 10H similarly to the barrier walls PW1 and PW2 shown in FIG. 5. Therefore, the separate portions 222op of the organic material layer 222o, which are spaced apart from each other due to the first openings 222oh, may be spaced apart from each other and may have the closed loop shapes entirely surrounding the opening area OA similarly to the barrier walls PW1 and PW2 shown in FIG. 5. On the cross-section, the separate portions 222op of the organic material layer 222o may cover the first barrier wall PW1, may cover the second barrier wall PW2, or may cover the portion between the second barrier wall PW2 and the opening 10H, as shown in FIG. 6. The separate portion 222op of the organic material layer 222o, which is on the first barrier wall PW1, on the second barrier wall PW2, or between the second barrier wall PW2 and the opening 10H, may be in a direct contact with and covered by the first inorganic encapsulation layer 310.

The second electrode 223 formed to entirely cover the display area DA extends to the intermediate area IA, and an edge portion 223ep of the second electrode 223 may be between the display area DA and one of the barrier walls PW1 and PW2. In an embodiment, as shown in FIG. 6, the edge portion 223ep of the second electrode 223 is between the display area DA and the first barrier wall PW1.

In an embodiment, the edge portion 223ep of the second electrode 223 shown in FIG. 6 is the closest portion of the second electrode 223 to the opening 10H, and a layer corresponding to the second electrode 223 may not exist in a region from the edge portion 223ep of the second electrode 223 to the opening 10H. In such an embodiment, a layer having a same material and a same structure as those of the second electrode 223 may not be provided between the edge portion 223ep of the second electrode 223 to the opening 10H.

Like the second electrode 223, the capping layer 225 may extend to the intermediate area IA, and one edge of the capping layer 225 may be between the display area DA and one of the barrier walls PW1 and PW2. In such an embodiment, a layer having a same material and a same structure as those of the capping layer 225 may not exist in a region from one edge of the capping layer 225 to the opening 10H.

The second electrode 223 includes a single second opening 223oh having a closed loop shape surrounding the opening area OA on a plane, and the capping layer 225 may also include a single third opening 225oh having a closed loop shape surrounding the opening area OA on a plane. The second opening 223oh and the third opening 225ohmay have a size (or width) that is enough for the first and second barrier walls PW1 and PW2 to be located in the second opening 223oh of the second electrode 223 and in the third opening 225oh of the capping layer 225.

The edge portion 223ep of the second electrode 223 may overlap and may be covered by an organic material layer, e.g., the organic encapsulation layer 320. The second electrode 223 may be obtained by forming a second electrode material layer that entirely covers the display area DA and the intermediate area IA and removing a part of the second electrode material layer in the intermediate area IA. A part of the second electrode material layer may be removed through a laser lift-off process, and the edge portion 223ep of the second electrode 223 may have an irregular shape due to the laser. In an embodiment, for example, the edge portion 223ep of the second electrode 223 may include a burr formed due to the laser lift-off process. The edge portion 223ep of the second electrode 223 may extend in an inclined direction to be away from the upper surface of the substrate 100, and a cross-section thereof may have irregular concavo-convex shapes.

The organic material layer 222o includes a plurality of first openings 222oh, whereas the second electrode 223 and/or the capping layer 225 may include the single second opening 223oh and/or the single third opening 225oh. The single second opening 223oh and/or the third opening 225oh may overlap a plurality of first openings 222oh. In such an embodiment, in the single second opening 223oh and/or the single third opening 225oh, the first openings 222oh and the separate portions 222op separated due to the first openings 222oh may be located.

Figure 7:
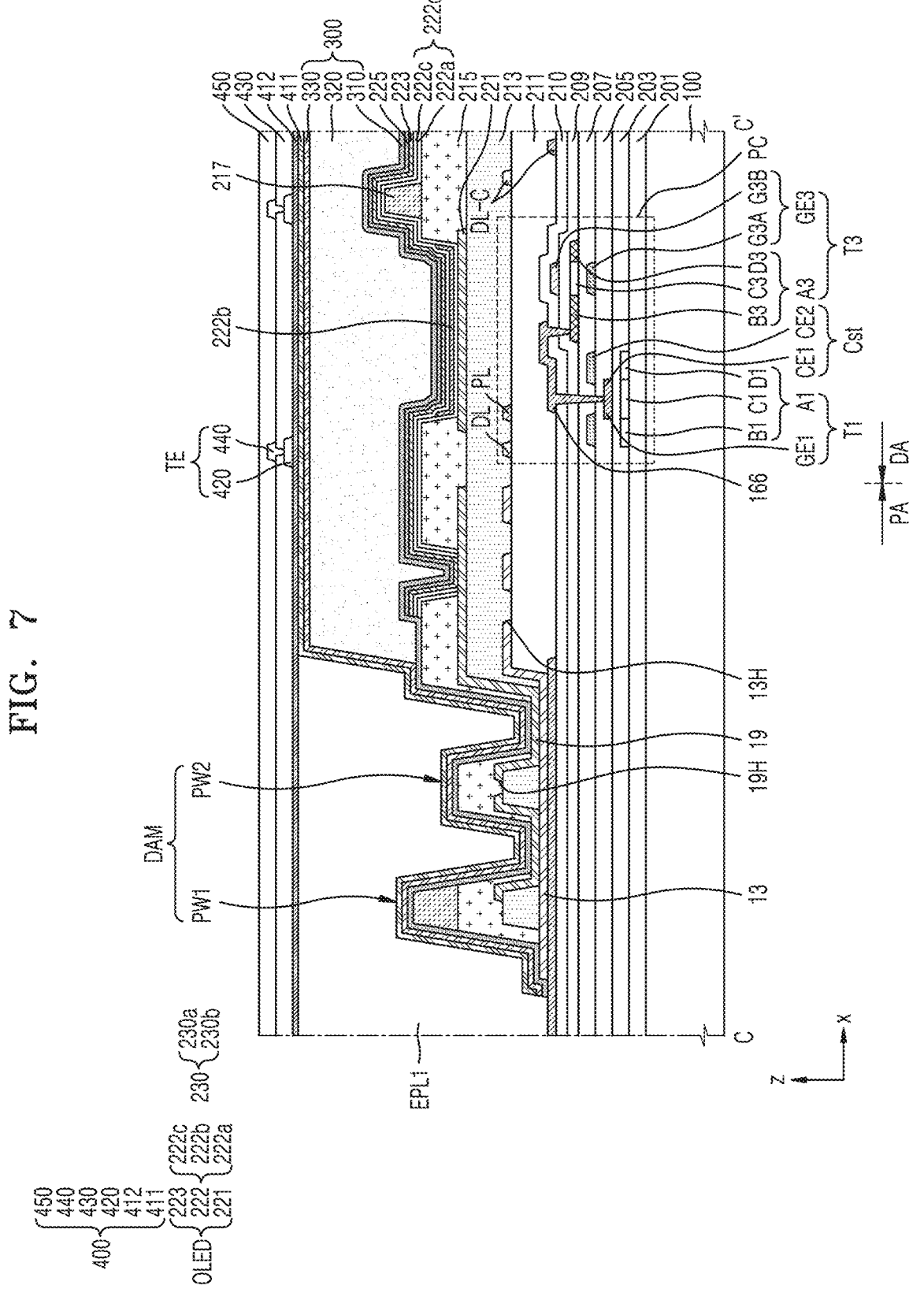
FIG. 7 is a cross-sectional view of the display panel of FIG. 3 taken along line C-C' of FIG. 3, according to an embodiment.
Figure 8:
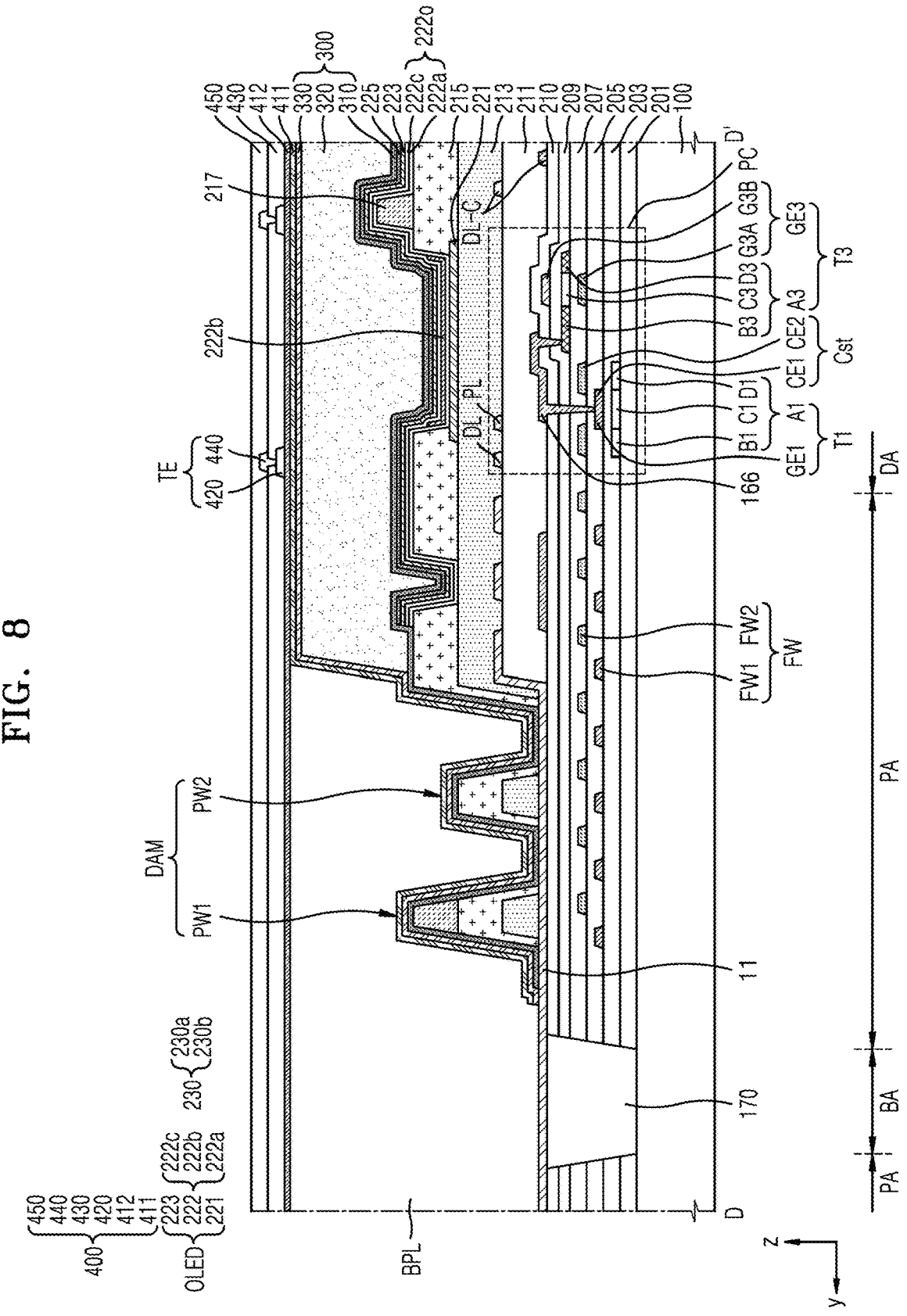
FIG. 8 is a cross-sectional view of the display panel of FIG. 3 taken along line D-D' of FIG. 3, according to an embodiment.

FIG. 7 is a cross-sectional view of the display panel 10 of FIG. 3 taken along a line C-C' of FIG. 3 according to an embodiment. FIG. 8 is a cross-sectional view of the display panel 10 of FIG. 3 taken along line D-D' of FIG. 3, according to an embodiment.

Referring to FIGS. 7 and 8, the structure of the display panel 10 may be the same as or similar to that of FIG. 6. The same or like elements shown in FIGS. 7 and 8 have been labeled with the same reference characters as used above to describe the embodiment shown in FIG. 6, and any repetitive detailed description thereof will hereinafter be omitted or simplified.

In an embodiment, a driving voltage supply line 11 may be in the peripheral area PA under the display area DA on a plane. The driving voltage supply line 11 may include a same material as that of one of the wirings between the first organic insulating layer 211 and the second organic insulating layer 213 in the display area DA. In an embodiment, for example, the driving voltage supply line 11 may include a same material as that of the data line DL on the first organic insulating layer 211 in the display area DA.

At least one wiring that is between the third interlayer insulating layer 210 and the first organic insulating layer 211 and overlaps the driving voltage supply line 11 may be further provided in the peripheral area PA. The at least one wiring may include a same material as that included in one of the wirings between the third interlayer insulating layer 210 and the first organic insulating layer 211 in the display area DA. In an embodiment, for example, the at least one wiring may include a same material as that of the driving voltage line PL on the third interlayer insulating layer 210 in the display area DA.

A plurality of fan-out wires FW may be in the peripheral area PA under the display area DA on a plane. In an embodiment, as shown in FIG. 8, the fan-out wires FW may be in different layers from one another with at least one insulating layer therebetween. In an embodiment, for example, a first fan-out wire FW1 in the first interlayer insulating layer 205 and a second fan-out wire FW2 in the second interlayer insulating layer 207 may be alternately provided. Accordingly, an interval between neighboring fan-out wires FW may be reduced. In an alternative embodiment, the fan-out wires FW may be in a same layer as each other. In an embodiment, for example, the fan-out wires FW may be in the first interlayer insulating layer 205 or in the second interlayer insulating layer 207.

A first scan driving circuit (not shown) and a second scan driving circuit (not shown) may be in the peripheral area PA. Referring to FIG. 3, the first scan driving circuit may include second thin film transistors (not shown) and wires (not shown) connected to the second thin film transistors. The second thin film transistor may be formed through a same process as the first thin film transistor (first transistor T1) of the pixel circuit PC, and thus, any repetitive detailed descriptions of the second thin film transistor are omitted. Although not shown in the drawings, a control signal line configured to apply a control signal to a first scan driving circuit may be further provided in the peripheral area PA. The control signal line may include signal lines for applying a clock signal, an inverted clock signal, a carry signal, etc. The control signal line may be in a same layer as that of a semiconductor layer, the gate electrode, the upper electrode CE2 of the storage capacitor Cst, or the driving voltage line PL.

An auxiliary line 19 may be provided in the peripheral area PA. The auxiliary line 19 is on the second organic insulating layer 213 in the peripheral area PA, and may be on a common voltage supply line 13 in the peripheral area PA. A hole 13H may be defined through a portion of the common voltage supply line 13 on the first organic insulating layer 211 in the peripheral area PA. A part of the auxiliary line 19 located in the peripheral area PA may be connected to the second electrode 223. In an embodiment, for example, the second electrode 223 may be in direct contact with the auxiliary line 19 that is exposed via a hole defined in the organic material layer 222o in the peripheral area PA. In the peripheral area PA, a part of the auxiliary line 19 overlaps the common voltage supply line 13 and may be in direct contact with the common voltage supply line 13. In the peripheral area PA, a part of the auxiliary line 19 may be between a plurality of layers included in a dam in a dam portion DAM. In the auxiliary line 19 located in the dam portion DAM, a hole 19H partially exposing an upper surface of a layer located under the auxiliary line 19 may be defined. The auxiliary line 19 may include a same material as that of one of wirings arranged between the second organic insulating layer 213 and the bank layer 215 in the display area DA. In an embodiment, for example, the auxiliary line 19 may include a same material as that of the first electrode 221 on the second organic insulating layer 213 in the display area DA.

The driving voltage supply line 11 and the common voltage supply line 13 may be on an inorganic layer. In an embodiment, for example, the driving voltage supply line 11 and the common voltage supply line 13 may be on an inorganic insulating layer including at least one selected from the buffer layer 201, the first interlayer insulating layer 205, the second interlayer insulating layer 207, and the third interlayer insulating layer 210.

When forming the organic encapsulation layer 320, it is desired to limit a material for forming the organic encapsulation layer 320 to be located within a preset region. Accordingly, in an embodiment, the dam portion DAM including at least one dam may be provided in the peripheral area PA.

The dam portion DAM may be provided as a line surrounding the display area DA. In an embodiment, the dam portion DAM may be under the edge protective layer EPL and the bending protective layer BPL. In such an embodiment, the dam portion DAM may be arranged, on a plane, between an outer boundary of the edge protective layer EPL and a boundary of the display area DA or between an outer boundary of the bending protective layer BPL and the boundary of the display area DA shown in FIG. 7 or FIG. 8. FIGS. 7 and 8 show an embodiment including two dams, e.g., first and second barrier walls PW1 and PW2. The number of dams in the dam portion DAM may vary. The first and second barrier walls PW1 and PW2 may be between the display area DA and the scan driver 2100 (see FIG. 3) and the display area DA and the data driver 2200 (see FIG. 3) of the substrate 100. The first and second barrier walls PW1 and PW2 may be on the inorganic layer. In an embodiment, for example, the first and second barrier walls PW1 and PW2 may be on an inorganic insulating layer including at least one selected from the buffer layer 201, the first interlayer insulating layer 205, the second interlayer insulating layer 207, and the third interlayer insulating layer 210.

The first inorganic encapsulation layer 310 and the second inorganic encapsulation layer 330 cover the first and second barrier walls PW1 and PW2 and may be formed to the outside of the first and second barrier walls PW1 and PW2. A location of the organic encapsulation layer 320 is defined by the first and second barrier walls PW1 and PW2, and overflow of the material for forming the organic encapsulation layer 320 to the outside of the first and second barrier walls PW1 and PW2 may be prevented.

At least some parts of the first and second barrier walls PW1 and PW2 may be on the power supply lines, e.g., the driving voltage supply line 11 and/or the common voltage supply line 13. The first and second barrier walls PW1 and PW2 may extend in the x-direction in the peripheral area PA, under the display area DA on a plane. The first and second barrier walls PW1 and PW2 may extend in the y-direction in the peripheral area PA, at left and right sides of the display area DA on a plane. Although not shown in the drawings, the first and second barrier walls PW1 and PW2 may extend in the x-direction in the peripheral area PA, above the display area DA on a plane.

Each of the plurality of dams in the dam portion DAM may have a multi-layered structure including a plurality of layers. In an embodiment, the first barrier wall PW1 at the outermost side may have a height that is relatively higher than that of the second barrier wall PW2 such that the dam portion DAM may limit the location of the material for forming the organic encapsulation layer 320. The first barrier wall PW1 located at the outermost side of the display area DA may have more layers to have the height that is greater than that of the second barrier wall PW2. In an embodiment, for example, the second barrier wall PW2 may include two layers, e.g., a first layer that is the lowermost layer and a second layer on the first layer, stacked in a direction away from the upper surface of the substrate 100, e.g., z-direction. The first barrier wall PW1 may include three layers, e.g., a first layer, a second layer on the first layer, and a third layer on the second layer stacked in the z-direction.

A touch insulating layer may be on the second inorganic encapsulation layer 330. in an embodiment, a first touch insulating layer 411 and a second touch insulating layer 412 may be on the second inorganic encapsulation layer 330, or the first touch insulating layer 411 may be on the second inorganic encapsulation layer 330.

The edge protective layer EPL and the bending protective layer BPL may be on the first touch insulating layer 411 or the second touch insulating layer 412 as above. Here, the edge protective layer EPL at the side surface of the display panel 10 may be on the boundary of the display area DA. The edge protective layer EPL may have a similar shape to that of the planarized insulating layer 401 described above. In such an embodiment, the edge protective layer EPL may be on the first touch insulating layer 411. Although not shown in the drawings, the edge protective layer EPL may be on the second touch insulating layer 412. The bending protective layer BPL may be also on the first touch insulating layer 411 or on the second touch insulating layer 412.

A region of the inorganic layer, from which a part of the inorganic layer is removed, may be under the bending protective layer BPL as above. Here, a separate planarization layer 170 may be in the region from which the inorganic layer is partially removed. The planarization layer 170 may include an organic material.

Figure 9A:
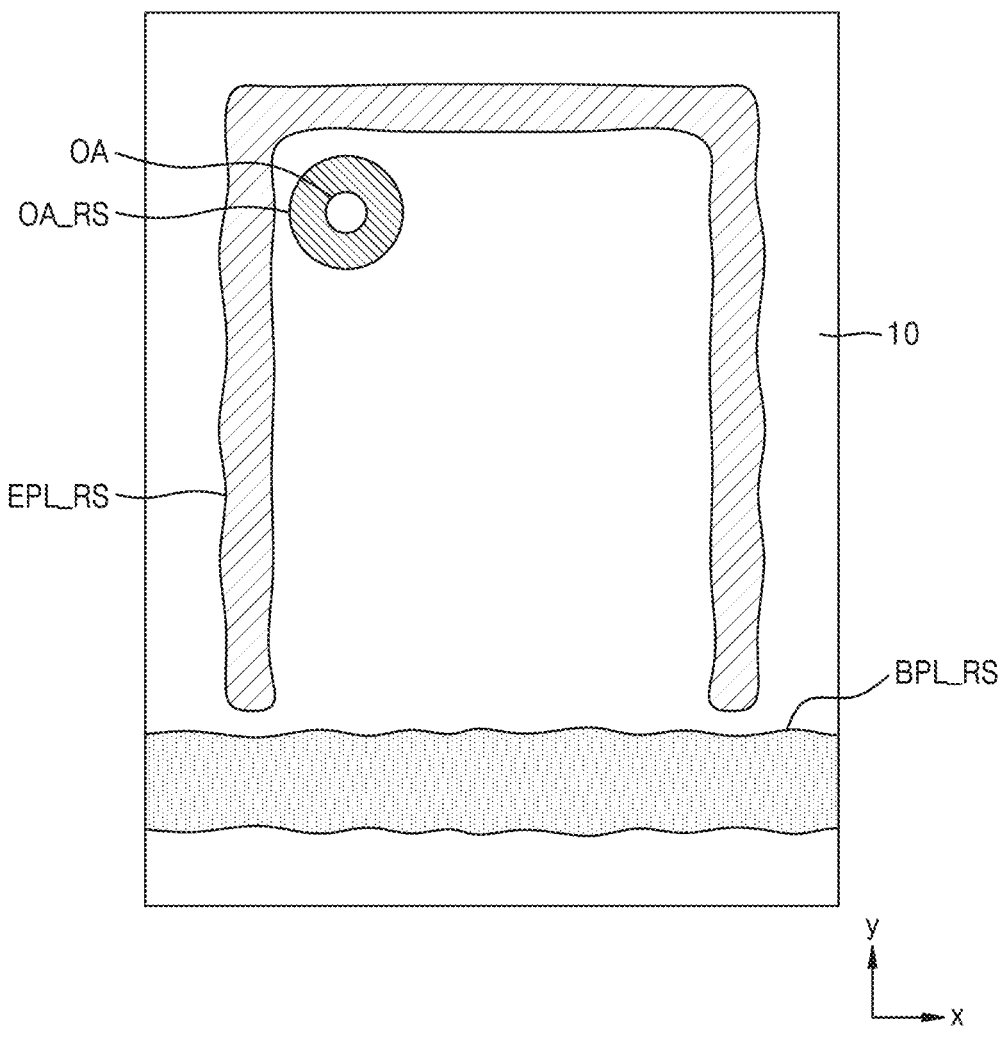
FIG. 9A is a plan view illustrating a method of manufacturing a display device, according to an embodiment.
Figure 9B:
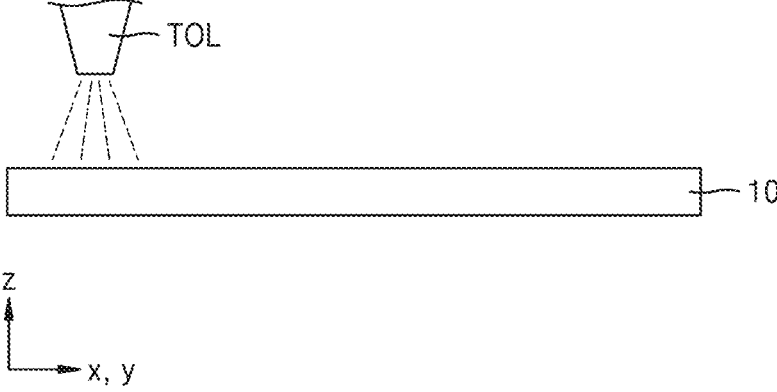
FIG. 9B is a plan view illustrating a method of manufacturing a display device, according to an embodiment, and shows a front view of a protective layer on the display panel of FIG. 9A.

FIG. 9A is a plan view illustrating a method of manufacturing a display device, according to an embodiment. FIG. 9B is a plan view illustrating a method of manufacturing a display device, according to an embodiment, and shows a front view of a protective layer on the display panel of FIG. 9A.

Referring to FIGS. 9A and 9B, in an embodiment of a method of manufacturing a display device, a display panel 10 in which layers from the buffer layer 201 to the first touch insulating layer 411 are stacked on the substrate 100 may be prepared. Subsequently, an edge protective layer-forming material EPL_RS, a bending protective layer-forming material BPL_RS, and a planarized insulating layer forming material OA_RS may be respectively supplied onto the display panel 10. Here, the edge protective layer-forming material EPL_RS, the bending protective layer-forming material BPL_RS, and the planarized insulating layer forming material OA_RS may be supplied to preset positions on the display panel 10 via a supply unit TOL. A plurality of supply units TOL may be used. In an embodiment, the supply units TOL may include a first supply unit for supplying the edge protective layer-forming material EPL_RS, a second supply unit for supplying the bending protective layer-forming material BPL_RS, and a third supply unit for supplying the planarized insulating layer forming material OA_RS. Here, each of the supply units may linearly move in at least one of a x-direction and a y-direction. Also, the first to third supply units may simultaneously supply the edge protective layer-forming material EPL_RS, the bending protective layer-forming material BPL_RS, and the planarized insulating layer forming material OA_RS to the display panel 10, respectively. In an alternative embodiment, the first to third supply units may sequentially supply the edge protective layer-forming material EPL_RS, the bending protective layer-forming material BPL_RS, and the planarized insulating layer forming material OA_RS to the display panel 10. In such an embodiment, paths of the first to third supply units may not overlap one another. Here, each of the edge protective layer-forming material EPL_RS, the bending protective layer-forming material BPL_RS, and the planarized insulating layer forming material OA_RS may be provided in the form of a resin.

When the supply is finished as above, an ultraviolet ("UV") rays, heat, laser, etc. may be supplied to each of the edge protective layer-forming material EPL_RS, the bending protective layer-forming material BPL_RS, and the planarized insulating layer forming material OA_RS, thereby hardening the edge protective layer-forming material EPL_RS, the bending protective layer-forming material BPL_RS, and the planarized insulating layer forming material OA_RS.

Figure 10:
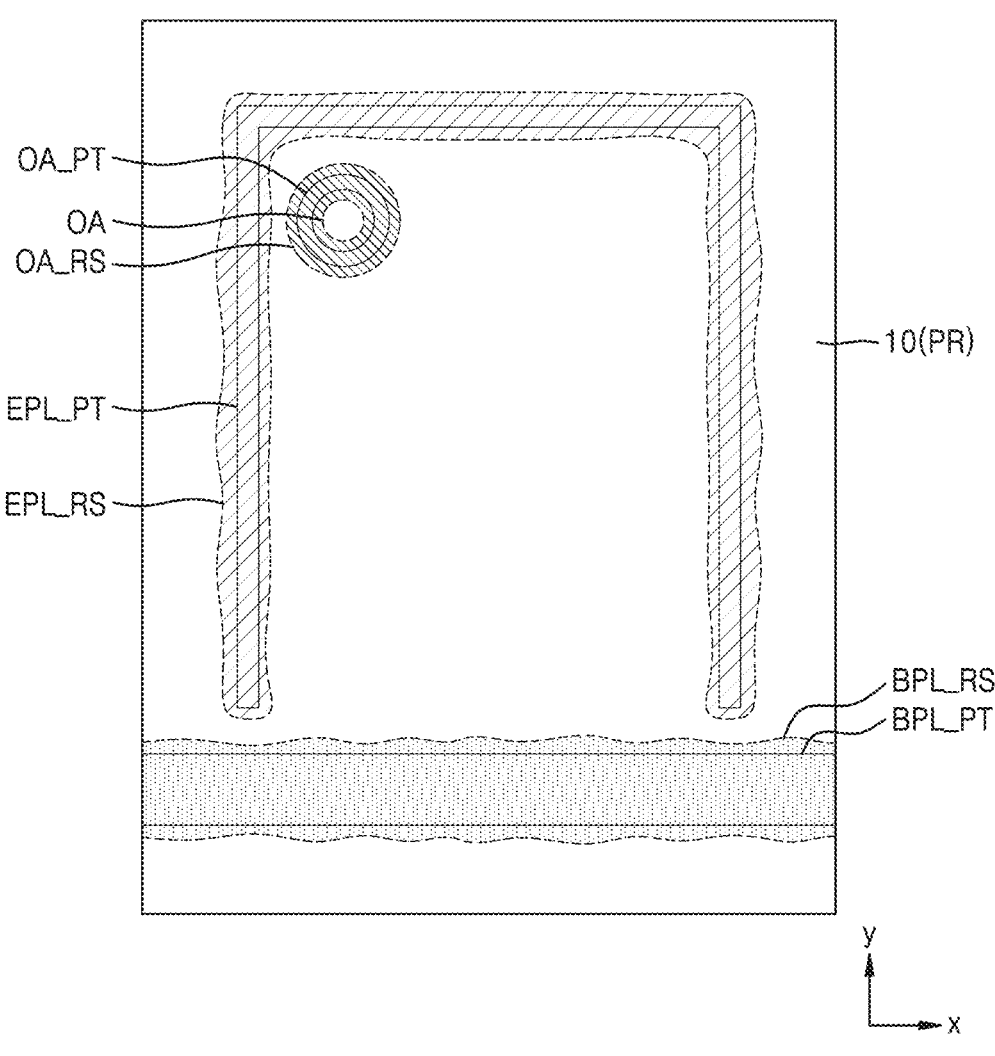
FIG. 10 is a plan view illustrating a method of manufacturing a display device, according to an embodiment.

FIG. 10 is a plan view illustrating a method of manufacturing a display device, according to an embodiment.

Referring to FIG. 10, after arranging the edge protective layer-forming material EPL_RS, the bending protective layer-forming material BPL_RS, and the planarized insulating layer forming material OA_RS on the display panel 10, a photoresist PR may be provided on the edge protective layer-forming material EPL_RS, the bending protective layer-forming material BPL_RS, and the planarized insulating layer forming material OA_RS.

The photoresist PR may be provided by various methods. In an embodiment, the photoresist PR may be provided on the entire surface of the display panel 10. In such an embodiment, the photoresist PR may be attached to the display panel 10 in the form of a film. Alternatively, the photoresist PR may be supplied to the entire surface of the display panel 10 in the form of a solution. Alternatively, the photoresist PR may be sprayed onto the entire surface of the display panel 10 in the form of mist. In another alternative embodiment, the photoresist PR may be provided on only a part of the display panel 10. In such an embodiment, the photoresist PR may be disposed on the edge protective layer-forming material EPL_RS, the bending protective layer-forming material BPL_RS, and the planarized insulating layer forming material OA_RS that are on the display panel 10. Hereinafter, an embodiment in which the photoresist PR is disposed on the entire surface of the display panel 10 will be described in detail for convenience of description.

The photoresist PR may be variously modified according to the shape thereof. In an embodiment, for example, the photoresist PR may include positive photoresist, in which a portion reacting to light is removed after development. In an alternative embodiment, the photoresist PR may include negative photoresist, in which a portion reacting to the light remains after development. Hereinafter, an embodiment in which the photoresist PR includes the positive photoresist will be described in detail below for convenience of description.

After providing the photoresist PR on the display panel 10, desired patterns may be formed respectively on the edge protective layer-forming material EPL_RS, the bending protective layer-forming material BPL_RS, and the planarized insulating layer forming material OA_RS by using photomasks having the desired patterns. Here, when the photoresist PR includes the positive photoresist, the light may be blocked by the photomask on the edge protective layer-forming material EPL_RS, the bending protective layer-forming material BPL_RS, and the planarized insulating layer forming material OA_RS. Alternatively, in the photoresist PR includes the negative photoresist, the light may pass through the photomask on the edge protective layer-forming material EPL_RS, the bending protective layer-forming material BPL_RS, and the planarized insulating layer forming material OA_RS.

Figure 11A:
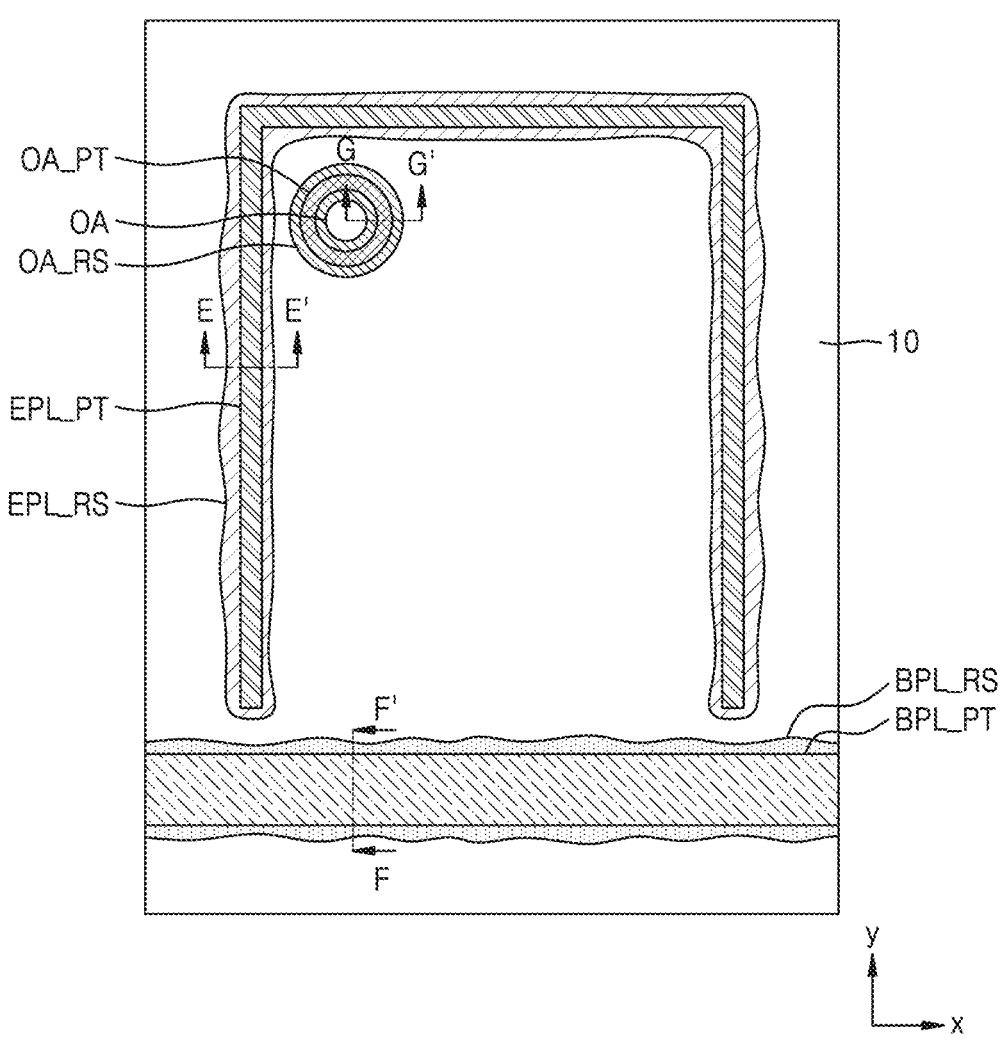
FIG. 11A is a plan view illustrating a method of manufacturing a display device, according to an embodiment.

FIG. 11A is a plan view illustrating a method of manufacturing a display device, according to an embodiment.

Referring to FIG. 11A, after development of the photoresist PR is completed on the display panel 10, the photoresist PR may be partially removed on the display panel 10. Here, some of the photoresist PR on the edge protective layer-forming material EPL_RS, the bending protective layer-forming material BPL_RS, and the planarized insulating layer forming material OA_RS may not be removed.

Figure 11B:
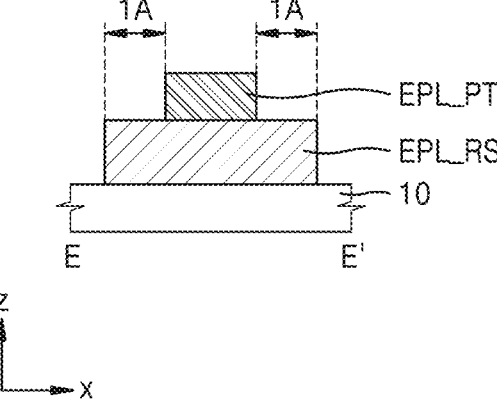
FIG. 11B is a cross-sectional view showing part of a display panel, part of a photoresist, and part of a protective layer-forming material, taken along line E-E' of FIG. 11A, according to an embodiment.

FIG. 11B is a cross-sectional view showing part of a display panel, part of a photoresist, and part of a protective layer-forming material, taken along line E-E' of FIG. 11A, according to an embodiment.

Referring to FIG. 11B, as described above with reference to FIG. 11A, when the development of the photoresist PR is finished, an edge protective layer forming pattern EPL_PT may be on the edge protective layer-forming material EPL_RS. Here, a width of the edge protective layer forming pattern EPL_PT measured in the first direction (e.g., x-direction of FIG. 11B) is less than that of the edge protective layer-forming material EPL_RS, the edge protective layer-forming material EPL_RS may be exposed to outside in a first area 1A. The edge protective layer-forming material EPL_RS exposed through the first area 1A may be removed to form the edge protective layer EPL.

Figure 11C:
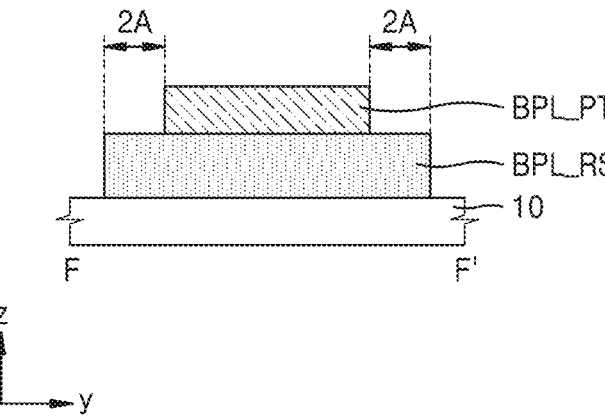
FIG. 11C is a cross-sectional view showing part of a display panel, part of a photoresist, and part of a protective layer-forming material, taken along line F-F' of FIG. 11A, according to an embodiment.

FIG. 11C is a cross-sectional view showing part of a display panel, part of a photoresist, and part of a protective layer-forming material, taken along line F-F' of FIG. 11A, according to an embodiment.

Referring to FIG. 11C, with respect to the bending protective layer-forming material BPL_RS, when the development is finished as described above with reference to FIG. 11A, a bending protective layer forming pattern BPL_PT may be formed on the bending protective layer-forming material BPL_RS exposed through a second area 2A. Subsequently, the bending protective layer-forming material BPL_RS in the second area 2A is removed through an etching, etc. to obtain the bending protective layer BPL.

Figure 11D:
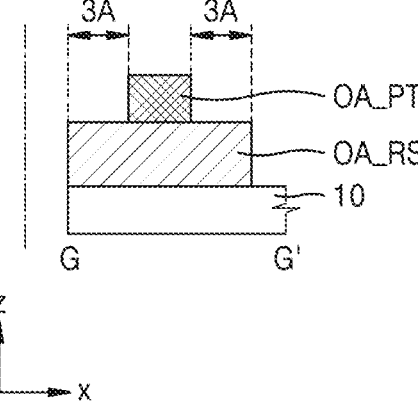
FIG. 11D is a cross-sectional view showing part of a display panel, part of a photoresist, and part of a protective layer-forming material, taken along line G-G' of FIG. 11A, according to an embodiment.

FIG. 11D is a cross-sectional view showing part of a display panel, part of a photoresist, and part of a protective layer-forming material, taken along line G-G' of FIG. 11A, according to an embodiment.

Referring to FIG. 11D, with respect to the planarized insulating layer 401, a planarized insulating layer forming pattern OA_PT may be formed on the planarized insulating layer forming material OA_RS arranged on the periphery of the opening area OA. Subsequently, the planarized insulating layer forming material OA_RS in the third area 3A may be removed by an etching solution.

Figure 12A:
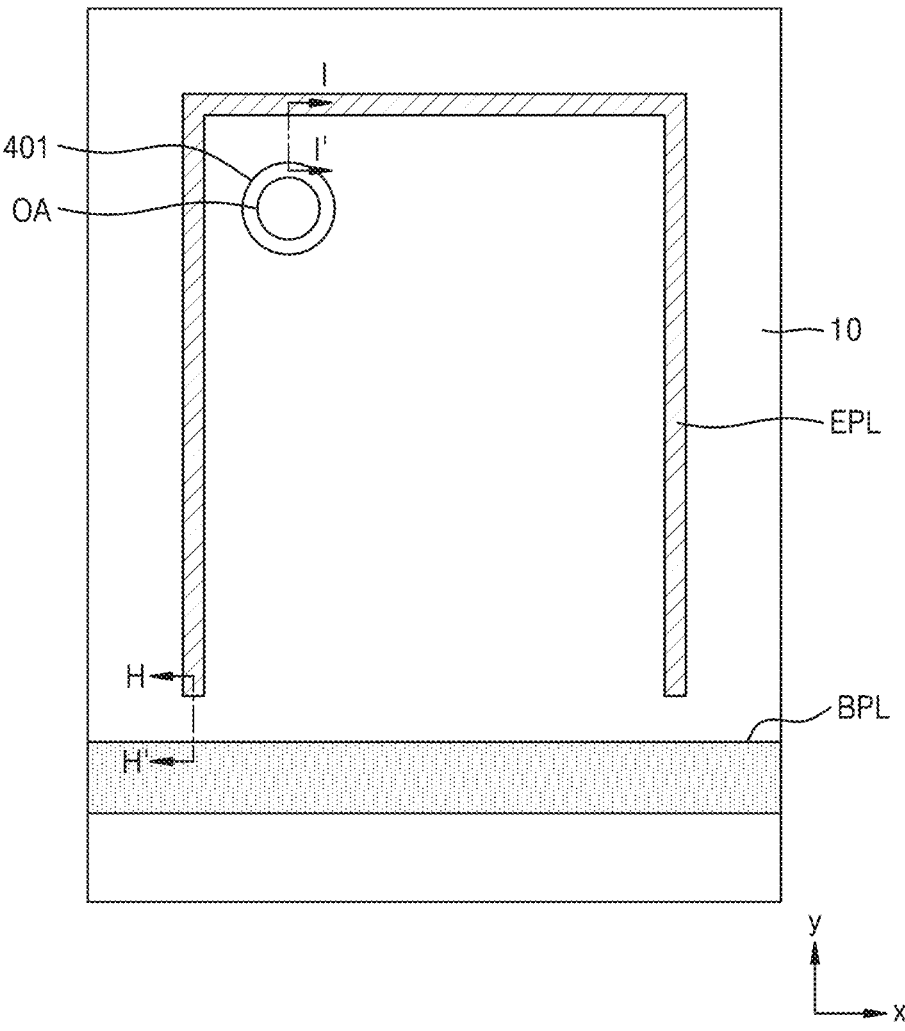
FIG. 12A is a plan view illustrating a method of manufacturing a display device, according to an embodiment.
Figure 12B:
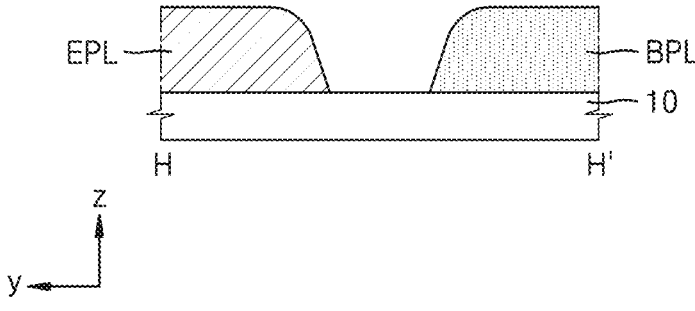
FIG. 12B is a cross-sectional view showing part of a display panel and part of a protective layer-forming material, taken along line H-H' of FIG. 12A, according to an embodiment.
Figure 12C:
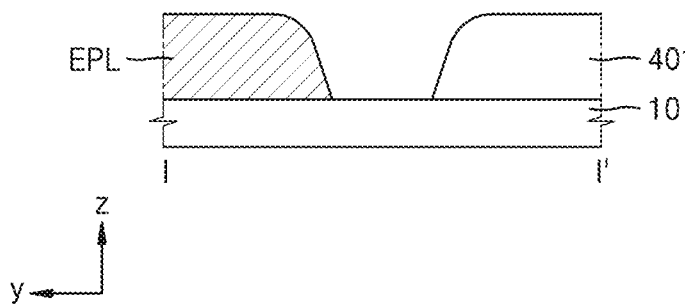
FIG. 12C is a cross-sectional view showing part of a display panel and part of a protective layer-forming material, taken along line I-I' of FIG. 12A, according to an embodiment.

FIG. 12A is a plan view illustrating a method of manufacturing a display device, according to an embodiment. FIG. 12B is a cross-sectional view showing part of a display panel and part of a protective layer-forming material, taken along line H-H' of FIG. 12A, according to an embodiment. FIG. 12C is a cross-sectional view showing part of a display panel and part of a protective layer-forming material, taken along line I-I' of FIG. 12A, according to an embodiment.

Referring to FIGS. 12A to 12C, in an embodiment, the edge protective layer EPL, the bending protective layer BPL, and the planarized insulating layer 401 may be on the display panel 10. In such an embodiment, the edge protective layer EPL, the bending protective layer BPL, and the planarized insulating layer 401 are similar to or the same as those described above with reference to FIG. 3, and thus, any repetitive detailed descriptions thereof will be omitted.

In such an embodiment, the edge protective layer EPL, the bending protective layer BPL, and the planarized insulating layer 401 may not overlap one another when seen on a plane. In such an embodiment, as shown in FIG. 12B, the end of the edge protective layer EPL may not overlap the bending protective layer BPL. Also, as shown in FIG. 12C, the edge protective layer EPL may not overlap the planarized insulating layer 401.

Figure 13A:
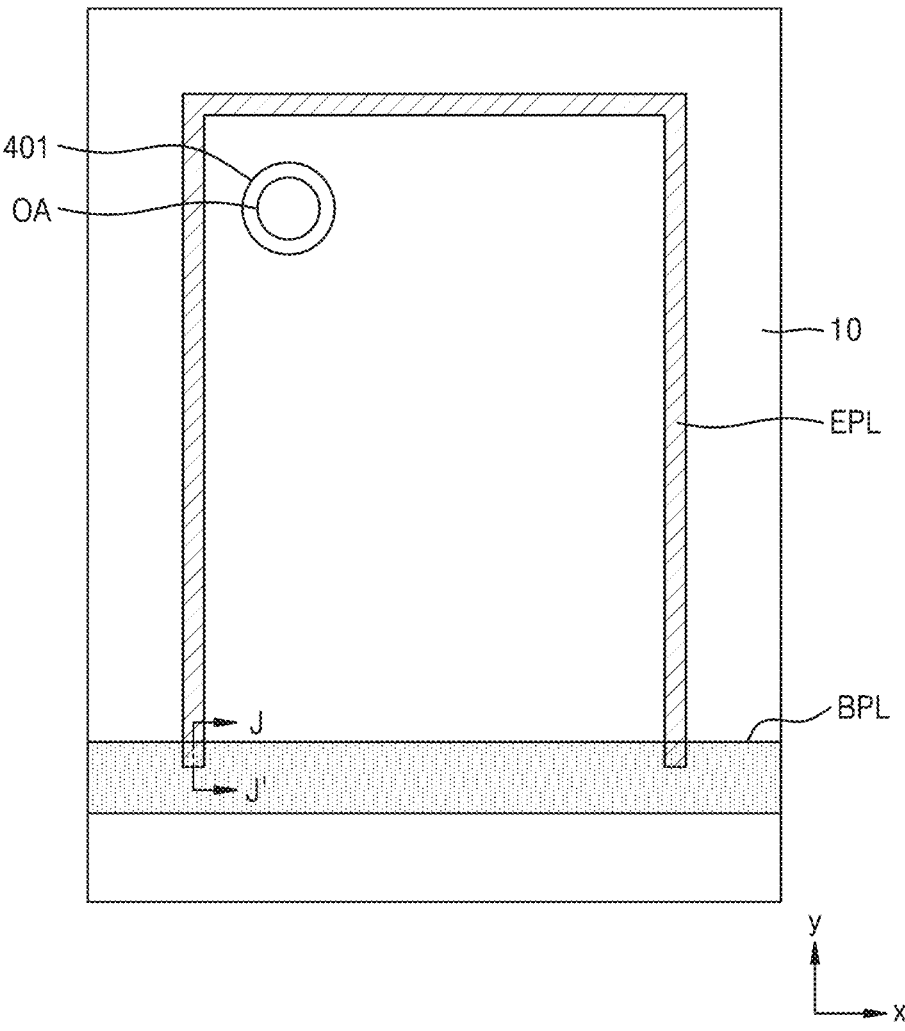
FIG. 13A is a plan view illustrating a method of manufacturing a display device, according to an embodiment.
Figure 13B:
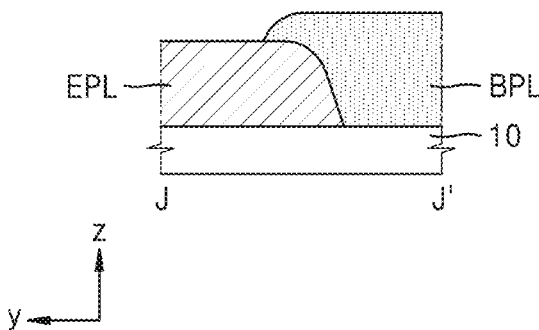
FIG. 13B is a cross-sectional view showing part of a display panel and part of a protective layer-forming material, taken along line J-J' of FIG. 13A, according to an embodiment.
Figure 13C:
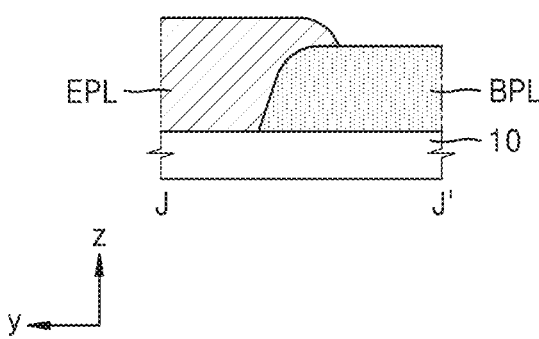
FIG. 13C is a cross-sectional view showing part of a display panel and part of a protective layer-forming material, taken along line J-J' of FIG. 13A, according to an embodiment.

FIG. 13A is a plan view illustrating a method of manufacturing a display device, according to an embodiment. FIG. 13B is a cross-sectional view showing part of a display panel and part of a protective layer-forming material, taken along line J-J' of FIG. 13A, according to an embodiment. FIG. 13C is a cross-sectional view showing part of a display panel and part of a protective layer-forming material, taken along line J-J' of FIG. 13A, according to an embodiment.

Referring to FIGS. 13A to 13C, in an embodiment, the edge protective layer EPL and the bending protective layer BPL may be formed to overlap each other on a plane. In such an embodiment, the end of the edge protective layer EPL may be in the bending protective layer BPL when seen on a plane. In such an embodiment, one of the edge protective layer EPL and the bending protective layer BPL may be on the other of the edge protective layer EPL and the bending protective layer BPL.

Referring to FIG. 13B, the end of the edge protective layer EPL may be under the bending protective layer BPL.

Referring to FIG. 13C, the end portion of the edge protective layer EPL may be on the bending protective layer BPL.

In such an embodiment, the planarized insulating layer 401 may not overlap the edge protective layer EPL.

Figure 14A:
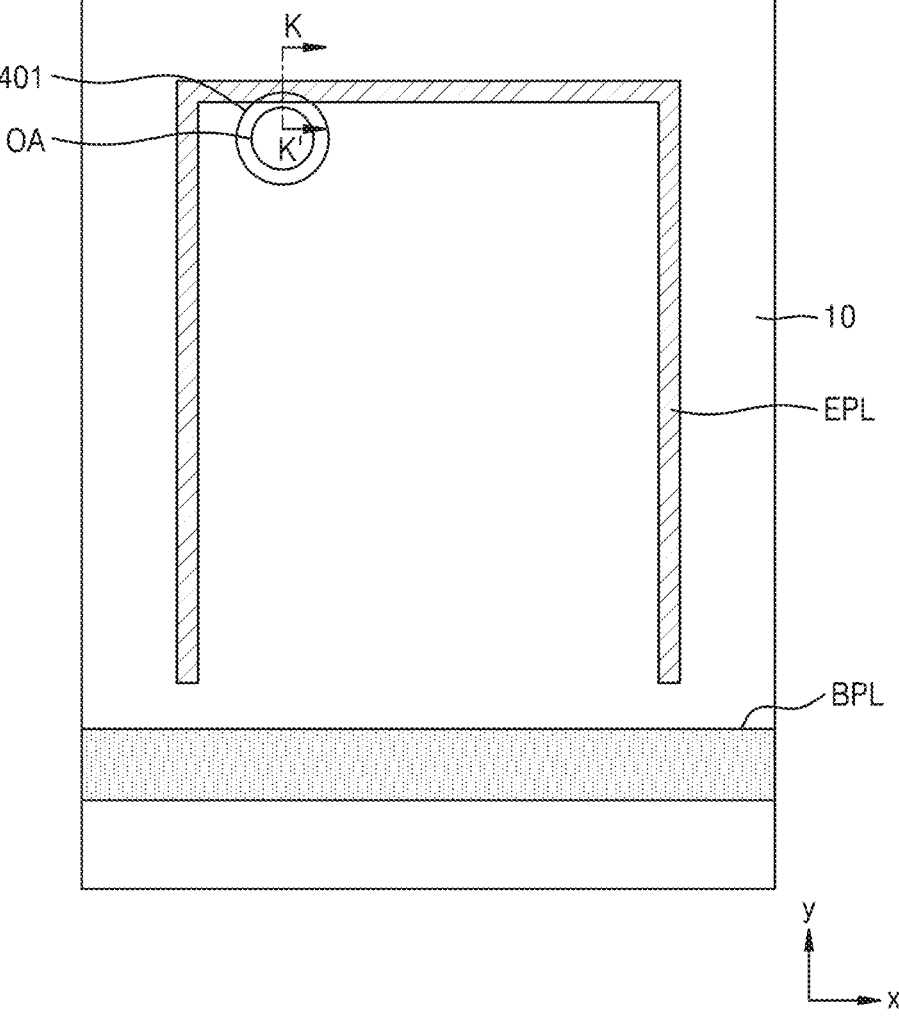
FIG. 14A is a plan view illustrating a method of manufacturing a display device, according to an embodiment.
Figure 14B:
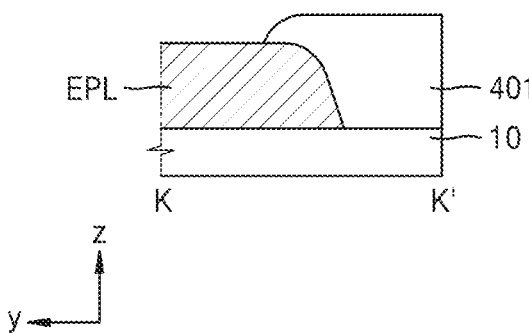
FIG. 14B is a cross-sectional view showing part of a display panel and part of a protective layer-forming material, taken along line K-K' of FIG. 14A, according to an embodiment.
Figure 14C:
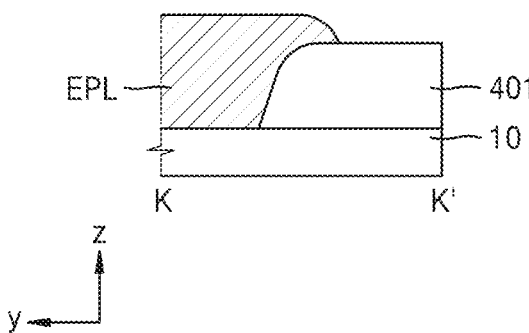
FIG. 14C is a cross-sectional view showing part of a display panel and part of a protective layer-forming material, taken along line K-K' of FIG. 14A, according to an alternative embodiment.

FIG. 14A is a plan view illustrating a method of manufacturing a display device, according to an embodiment. FIG. 14B is a cross-sectional view showing part of a display panel and part of a protective layer-forming material, taken along line K-K' of FIG. 14A, according to an embodiment. FIG. 14C is a cross-sectional view showing part of a display panel and part of a protective layer-forming material, taken along line K-K' of FIG. 14A, according to an alternative embodiment.

Referring to FIG. 14A, in an embodiment, the edge protective layer EPL may overlap the planarized insulating layer 401 when seen on a plane. In such an embodiment, the edge protective layer EPL may be under the planarized insulating layer 401 as shown in FIG. 14B, or the edge protective layer EPL may be on the planarized insulating layer 401 as shown in FIG. 14C.

Figure 15:
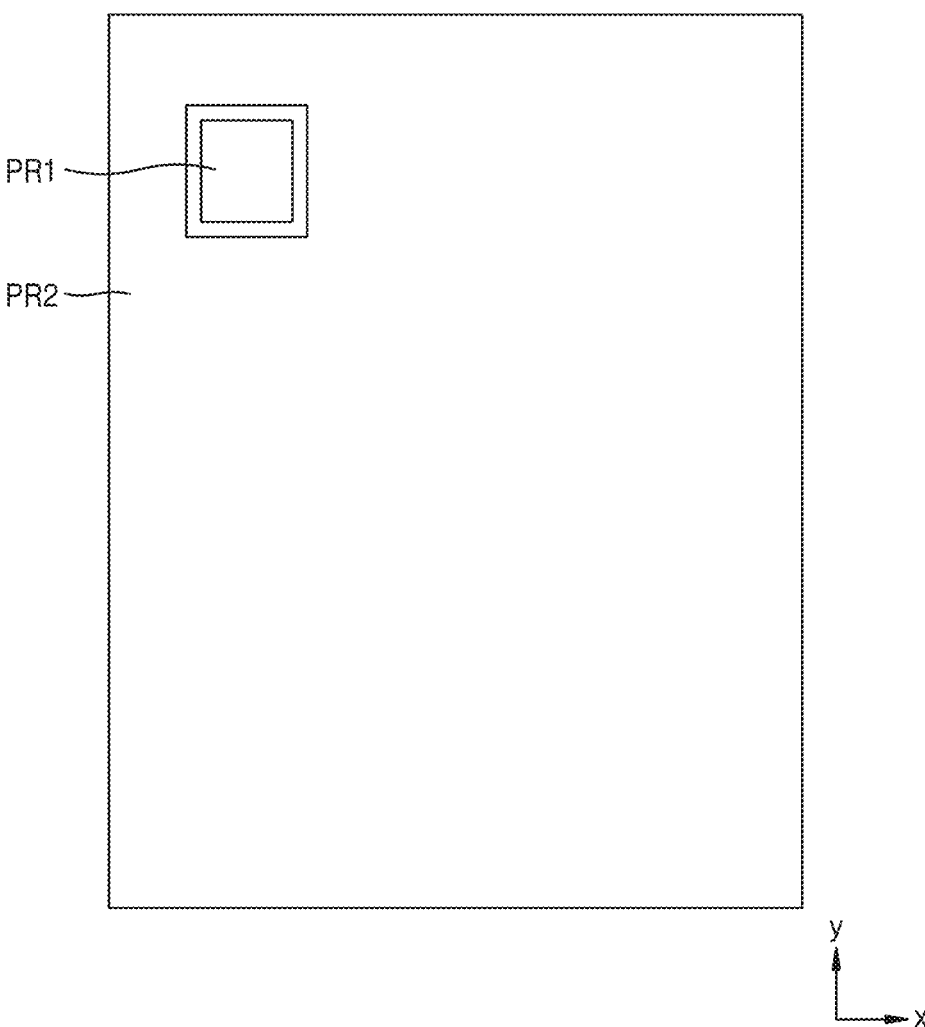
FIG. 15 is a plan view illustrating a method of manufacturing a display device, according to an embodiment.

FIG. 15 is a plan view illustrating a method of manufacturing a display device, according to an embodiment.

Referring to FIG. 15, in an embodiment where the edge protective layer EPL, the bending protective layer BPL, and the planarized insulating layer 401 are on the display panel 10, a plurality of photoresist PR may be used. In such an embodiment, the number of the photoresists PR may not limited to those shown in FIG. 15, and the plurality of photoresists PR may respectively correspond to the edge protective layer EPL, the bending protective layer BPL, and the planarized insulating layer 401. Hereinafter, the arrangement of the plurality of photoresists PR of an embodiment shown in FIG. 15 will be described in detail below for convenience of description.

The plurality of photoresists PR may include a first photoresist PR1 including one of the positive photoresist and the negative photoresist, and a second photoresist PR2 including the other one of the positive photoresist and the negative photoresist.

In such an embodiment, the edge protective layer forming pattern EPL_PT, the bending protective layer forming pattern BPL_PT, and the planarized insulating layer forming pattern OA_PT may be formed through the first photoresist PR1 and the second photoresist PR2 in various orders. In an embodiment, for example, the planarized insulating layer forming pattern OA_PT may be obtained first by developing the first photoresist PR1, and then, the second photoresist PR2 is arranged and developed to obtain the bending protective layer forming pattern BPL_PT and the edge protective layer forming pattern EPL_PT. In an alternative embodiment, the first photoresist PR1 and the second photoresist PR2 are arranged, and then, a photomask is arranged to perform the exposure and the development processes such that the edge protective layer forming pattern EPL_PT, the bending protective layer forming pattern BPL_PT, and the planarized insulating layer forming pattern OA_PT may be simultaneously obtained. Hereinafter, for convenience of description, an embodiment in which the edge protective layer forming pattern EPL_PT, the bending protective layer forming pattern BPL_PT, and the planarized insulating layer forming pattern OA_PT are simultaneously formed will be described in detail below. As described above, when the edge protective layer forming pattern EPL_PT, the bending protective layer forming pattern BPL_PT, and the planarized insulating layer forming pattern OA_PT are obtained, the edge protective layer EPL, the bending protective layer BPL, and the planarized insulating layer 401 may be formed through the etching as described above.

Therefore, according to an embodiment of the method of manufacturing the display device, various photoresists PR are arranged on a same plane, and then, the protective layers at different portions may be obtained. Also, according to an embodiment of the method of manufacturing the display device, the photoresist PR suitable for each protective layer may be arranged based on the shape and location of each protective layer, and then, the protective layer may be obtained.

Figure 16:
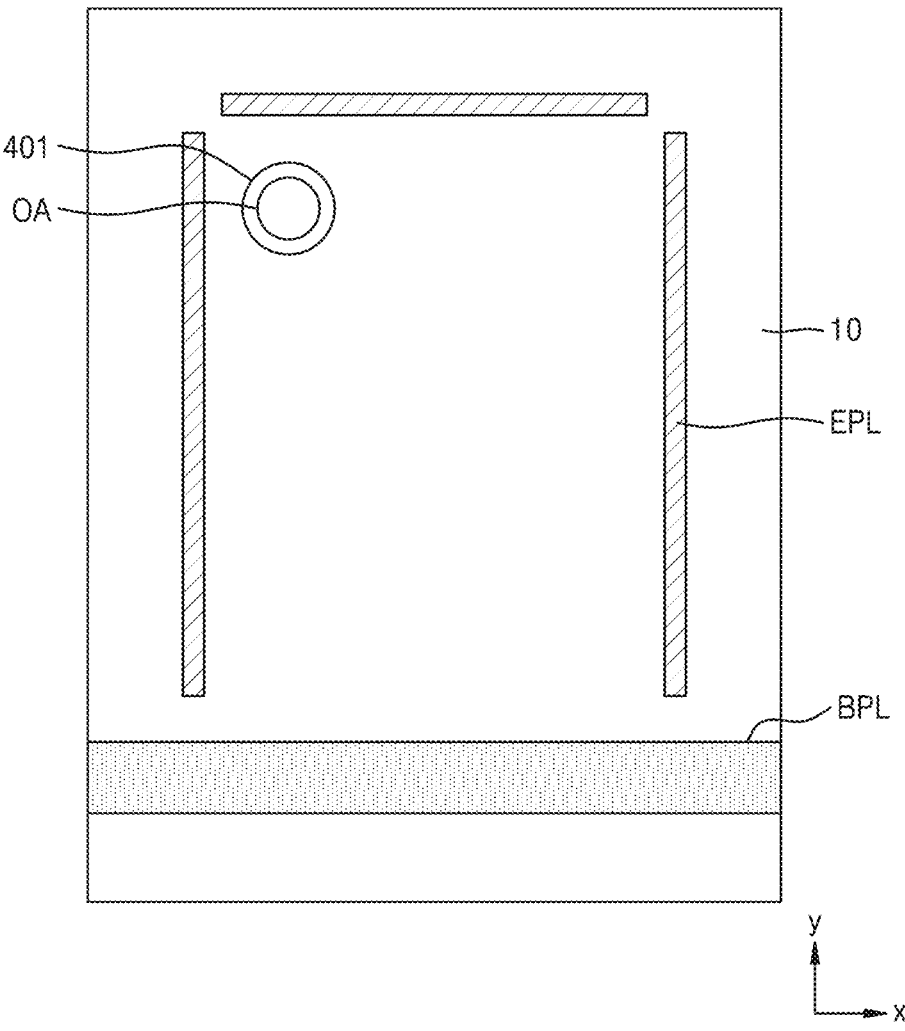
FIG. 16 is a plan view illustrating a method of manufacturing a display device, according to an embodiment.

FIG. 16 is a plan view illustrating a method of manufacturing a display device, according to an embodiment.

Referring to FIG. 16, the edge protective layer EPL, the bending protective layer BPL, and the planarized insulating layer 401 may be on the display panel 10. Here, the bending protective layer BPL and the planarized insulating layer 401 are similar to or the same as those described above, and thus, any repetitive detailed descriptions thereof will be omitted.

In an embodiment, a plurality of edge protective layers EPL may be provided. Here, the edge protective layers EPL may be respectively on different boundaries of the display area DA. In such an embodiment, the plurality of edge protective layers EPL may not be connected to one another.

Embodiments of the display device according to the disclosure includes each protective layer to reinforce a bent portion or reduce the disconnection in the wirings.

In embodiments of the display device according to the disclosure, the protective layers in different positions may be simultaneously provided or formed.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate;
a display area on the substrate, wherein the display area comprises a plurality of pixels;
a peripheral area on the substrate, wherein the peripheral area is on a periphery of the display area;
a first protective layer on the substrate, wherein the first protective layer is in the display area and the peripheral area; and
a second protective layer on the substrate, wherein the second protective layer is in the peripheral area,
wherein an end portion of the first protective layer and an end portion of the second protective layer overlap each other, and
wherein a remaining portion of the first protective layer except for the end portion thereof and a remaining portion of the second protective layer except for the end portion thereof do not overlap each other.

2. The display device of claim 1, wherein the end portion of one of the first protective layer and the second protective layer and the end portion of the other of the first protective layer and the second protective layer are sequentially stacked one on another.

3. The display device of claim 1, wherein
the first protective layer is arranged in a first direction, and
the second protective layer is arranged in a second direction different from the first direction.

4. The display device of claim 1, wherein the first protective layer and the second protective layer include different materials from each other.

5. The display device of claim 1, further comprising:
an opening area in the substrate, wherein a component is provided in the opening area; and
a third protective layer on a circumference of the opening area.

6. The display device of claim 5, wherein a planar shape of the third protective layer is a loop shape.

7. The display device of claim 5, wherein a part of the third protective layer overlaps a part of the first protective layer.

8. The display device of claim 1, wherein the first protective layer surrounds a boundary of the display area.

9. The display device of claim 8, wherein
the first protective layer is provided in plural, and
the plurality of first protective layers are spaced apart from one another along the boundary of the display area.

*   *   *   *   *